(12) United States Patent
Lim et al.

(10) Patent No.: US 12,382,808 B2
(45) Date of Patent: Aug. 5, 2025

(54) DISPLAY APPARATUS INCLUDING OVERLAPPING ELEMENTS

(71) Applicant: SAMSUNG DISPLAY CO., LTD., Yongin-si (KR)

(72) Inventors: Seokhyun Lim, Yongin-si (KR); Joohee Jeon, Yongin-si (KR); Sunmi Kang, Yongin-si (KR); Juhoon Kang, Yongin-si (KR); Hyungkeun Park, Yongin-si (KR); Donghwan Shim, Yongin-si (KR); Miyeon Cho, Yongin-si (KR); Gunhee Kim, Yongin-si (KR); Sunyoung Jung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/453,450

(22) Filed: Aug. 22, 2023

(65) Prior Publication Data
US 2023/0397467 A1 Dec. 7, 2023

Related U.S. Application Data

(62) Division of application No. 17/815,197, filed on Jul. 26, 2022, now Pat. No. 11,765,953.

(30) Foreign Application Priority Data

Nov. 15, 2021 (KR) .......................... 10-2021-0157097

(51) Int. Cl.
*H10K 59/131* (2023.01)
*G09G 3/3233* (2016.01)

(52) U.S. Cl.
CPC ....... *H10K 59/1315* (2023.02); *G09G 3/3233* (2013.01); *G09G 2300/0426* (2013.01);
(Continued)

(58) Field of Classification Search
CPC ............ H01L 27/3279; H10K 59/1213; H10K 59/1216; H10K 59/131; H10K 59/121;
(Continued)

(56) References Cited

U.S. PATENT DOCUMENTS

| | | | |
|---|---|---|---|
| 9,324,266 B2 | 4/2016 | Hwang et al. | |
| 10,733,922 B2 | 8/2020 | Park et al. | |

(Continued)

FOREIGN PATENT DOCUMENTS

| | | |
|---|---|---|
| KR | 10-2018-0132200 | 12/2018 |
| KR | 10-2020-0000853 | 1/2020 |

(Continued)

*Primary Examiner* — David Tung
(74) *Attorney, Agent, or Firm* — F. CHAU & ASSOCIATES, LLC

(57) ABSTRACT

A display apparatus includes a first transistor including a first semiconductor layer and a first electrode that at least partially overlaps the first semiconductor layer. A first capacitor includes the first electrode and a second electrode that at least partially overlaps the first electrode. A second capacitor includes the second electrode and a third electrode that at least partially overlaps the second electrode. A first data line is configured to transfer a data voltage therethrough. First and second scan lines are configured to transfer first and second scan signals therethrough, respectively. A second transistor connects the first data line to the second electrode in response to the first scan signal. A third transistor connects the first electrode to a drain of the first transistor in response to the second scan signal.

20 Claims, 13 Drawing Sheets

(52) U.S. Cl.
CPC .............. *G09G 2300/0819* (2013.01); *G09G 2300/0852* (2013.01)

(58) Field of Classification Search
CPC ........... H10K 59/1315; H10K 29/7869; G09G 3/3233; G09G 2300/0426; G09G 2300/0819; G09G 2300/0852; G09G 2300/0861; G09G 2310/0251; G09G 2320/043

See application file for complete search history.

(56) References Cited

U.S. PATENT DOCUMENTS

| | | |
|---|---|---|
| 10,847,595 B2 | 11/2020 | Jeon et al. |
| 11,195,893 B2 | 12/2021 | Lee et al. |
| 2011/0025659 A1 | 2/2011 | Kwak et al. |
| 2013/0015448 A1 | 1/2013 | Yang et al. |
| 2014/0117320 A1* | 5/2014 | Jung .................... H10K 59/131 257/40 |
| 2014/0353619 A1 | 12/2014 | Park et al. |
| 2015/0348464 A1 | 12/2015 | In et al. |
| 2016/0123084 A1 | 5/2016 | Hanns et al. |
| 2016/0322453 A1* | 11/2016 | Park ..................... H10K 59/124 |
| 2017/0077202 A1 | 3/2017 | Ha |
| 2017/0141169 A1 | 5/2017 | Sim et al. |
| 2017/0199616 A1 | 7/2017 | Kim et al. |
| 2019/0088200 A1 | 3/2019 | Woo et al. |
| 2019/0288048 A1 | 3/2019 | Kang et al. |
| 2019/0103455 A1* | 4/2019 | Song .................. H10K 59/1213 |
| 2019/0172890 A1* | 6/2019 | Cho ....................... H10K 59/88 |
| 2019/0189722 A1 | 6/2019 | Lim et al. |
| 2019/0237481 A1 | 8/2019 | Kimura |
| 2019/0386032 A1* | 12/2019 | Hsu ..................... H10K 59/131 |
| 2020/0006401 A1 | 1/2020 | Hwang et al. |
| 2020/0058725 A1* | 2/2020 | Ka ...................... H01L 27/1218 |
| 2020/0373375 A1 | 11/2020 | Na et al. |
| 2021/0082343 A1 | 3/2021 | Lee et al. |
| 2021/0280130 A1 | 9/2021 | Wang et al. |
| 2023/0157112 A1 | 5/2023 | Lim et al. |

FOREIGN PATENT DOCUMENTS

| | | |
|---|---|---|
| KR | 10-2104981 | 5/2020 |
| KR | 10-2020-0082072 | 7/2020 |
| KR | 10-2020-0133890 | 12/2020 |
| KR | 10-2021-0013460 | 2/2021 |
| KR | 10-2021-0111945 | 9/2021 |

* cited by examiner

# DISPLAY APPARATUS INCLUDING OVERLAPPING ELEMENTS

CROSS-REFERENCE TO RELATED APPLICATION

This application is a Division of co-pending U.S. patent application Ser. No. 17/815,197 filed on Jul. 26, 2022, which is based on and claims priority under 35 U.S.C. § 119 to Korean Patent Application No. 10-2021-0157097, filed on Nov. 15, 2021, in the Korean Intellectual Property Office, the disclosure of which is incorporated by reference herein in its entirety.

TECHNICAL FIELD

The present disclosure relates to a display and, more specifically, to a display apparatus including overlapping capacitors or connection lines.

DISCUSSION OF THE RELATED ART

A display apparatus displays data visually and may be used in a wide variety of electronic devices including large devices like televisions and electronic billboards and small devices such as smartphones and watches.

The display apparatus may display an image using a plurality of pixels that each receive an electrical signal and emit light so that they may together display an image. Each pixel includes a display element; for example, an organic light-emitting diode display includes an organic light-emitting diode (OLED) as a display element. In general, in an organic light-emitting display apparatus, a thin-film transistor and an organic light-emitting diode are formed on a substrate, and an image is formed as the organic light-emitting diodes emit light.

SUMMARY

A display apparatus includes a first transistor. The first transistor includes a first semiconductor layer and a first electrode that at least partially overlaps the first semiconductor layer in a depth direction. The display apparatus further includes a first capacitor including the first electrode and a second electrode that at least partially overlaps the first electrode in a depth direction. A second capacitor includes the second electrode and a third electrode that at least partially overlapping the second electrode in a depth direction. A first data line is configured to transfer a data voltage. First and second scan lines are configured to transfer first and second scan signals, respectively. A second transistor connects the first data line to the second electrode in response to the first scan signal. A third transistor connects the first electrode to a drain of the first transistor in response to the second scan signal.

As used herein, the phrase "connects X to Y in response to Z" means that a connection between X and Y is established and/or terminated as a result of the reception of or the change in value for a signal Z.

The depth direction is a direction orthogonal to a plane of a display surface of the display apparatus. The display surface may be a surface through which the display is viewed and may be a front surface of the display device.

The third transistor may be arranged over the first transistor and may include a second semiconductor layer and a fourth electrode that at least partially overlaps the second semiconductor layer. The first semiconductor layer may include a silicon semiconductor material. The second semiconductor layer may include an oxide semiconductor material.

The display apparatus may further include a substrate in which a display area and a peripheral area that at least partially surrounds the display area are defined. Second and third data lines are arranged in the display area. A pad portion is arranged at one side of the peripheral area and the pad portion includes first to third data pads. A first connection line connects the first data line arranged in the display area to the first data pad. A second connection line connects the second data line to the second data pad. A third connection line connects the third data line to the third data pad. The first to third connection lines are arranged on different layers from each other.

The first connection line may be arranged on a same layer as the first electrode. The second connection line may be arranged on a same layer as the fourth electrode. The third connection line may be arranged on a same layer as the third electrode.

The display apparatus may further include a fifth electrode that is arranged below the second semiconductor layer, at least partially overlaps the second semiconductor layer, and is electrically connected to the fourth electrode.

The fifth electrode may be arranged on a same layer as either the second electrode or the third electrode.

The first transistor may have a conductivity type that is opposite to a conductivity type of the third transistor.

The second transistor may have a same conductivity type as a conductivity type of the third transistor.

The display apparatus may further include a power line electrically connected to the third electrode and configured to transfer a driving voltage.

The display apparatus may further include a display element having an anode and a cathode. A third scan line may be configured to transfer a third scan signal. A fourth scan line may be configured to transfer a fourth scan signal. An emission control line may be configured to transfer an emission control signal. A first voltage line may be configured to transfer an initialization voltage. A fourth transistor may connect the first voltage line to the first electrode in response to the third scan signal. A fifth transistor may connect the power line to a source of the first transistor in response to the emission control signal. A sixth transistor may connect the drain of the first transistor to the anode of the display element in response to the emission control signal. A seventh transistor may connect the first voltage line to the anode of the display element in response to the fourth scan signal.

The display apparatus may further include a second voltage line configured to transfer a reference voltage. An eighth transistor may connect the second voltage line to the second electrode in response to the second scan signal.

The display apparatus may further include a third voltage line configured to transfer a bias voltage. A ninth transistor may connect the third voltage line to the source of the first transistor in response to the fourth scan signal.

A display apparatus includes a substrate in which a display area and a peripheral area that at least partially surrounds the display area are defined. A plurality of data lines is arranged in the display area with each of the plurality of data lines being extended in a first direction. A pad portion is arranged at one side of the peripheral area and includes a plurality of data pads. A plurality of first connection lines connects first data lines, among the plurality of data lines, to corresponding data pads from among the plurality of data pads. A plurality of second connection lines connect second data lines, among the plurality of data lines, to corresponding data pads from among the plurality of data pads. A plurality of third connection lines connect third data lines, among the plurality of data lines, to corresponding data pads from among the plurality of data pads. The plurality of first connection lines, the plurality of second connection lines, and the plurality of third connection lines are arranged on different layers from each other.

The plurality of first connection lines and the plurality of second connection lines may be each arranged between two third connection lines, among the plurality of third connection lines, that are adjacent to each other in the first direction.

The plurality of second connection lines may be arranged over the plurality of first connection lines. The plurality of third connection lines may be arranged over the plurality of second connection lines.

A number of the plurality of third connection lines per unit area may be greater than a number of the plurality of first connection lines per unit area. The number of the plurality of third connection lines per unit area may be greater than a number of the plurality of second connection lines per unit area.

A number of the plurality of first connection lines per unit area may be equal to the number of the plurality of second connection lines per unit area.

The plurality of third connection lines may have a multi-layered structure.

Each of the plurality of third connection lines may include a first layer, a third layer disposed over the first layer, and a second layer disposed between the first layer and the third layer.

The plurality of second connection lines may have a same layer structure as a layer structure of the plurality of third connection lines.

The display apparatus may further include a first transistor arranged in the display area. The first transistor may include a first semiconductor layer and a first electrode that at least partially overlaps the first semiconductor layer. A first capacitor may be arranged in the display area and may include the first electrode and a second electrode that at least partially overlaps the first electrode. A second capacitor may be arranged in the display area and may include the second electrode and a third electrode that at least partially overlaps the second electrode. A second transistor may be arranged over the first transistor in the display area and may include a second semiconductor layer and a fourth electrode that at least partially overlaps the second semiconductor layer.

The plurality of first connection lines may be arranged on a same layer as the first electrode. The plurality of second connection lines may be arranged on a same layer as the third electrode. The plurality of third connection lines may be arranged on a same layer as the fourth electrode. The plurality of first connection lines may be arranged on a same layer as the first electrode. The plurality of second connection lines may be arranged on a same layer as the second electrode. The plurality of third connection lines may be arranged on a same layer as the third electrode. The plurality of first connection lines may be arranged on a same layer as the first electrode. The plurality of second connection lines may be arranged on a same layer as the second electrode. The plurality of third connection lines may be arranged on a same layer as the fourth electrode.

The plurality of first connection lines may be arranged on a same layer as the second electrode. The plurality of second connection lines may be arranged on a same layer as the third electrode. The plurality of third connection lines may be arranged on a same layer as the fourth electrode.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
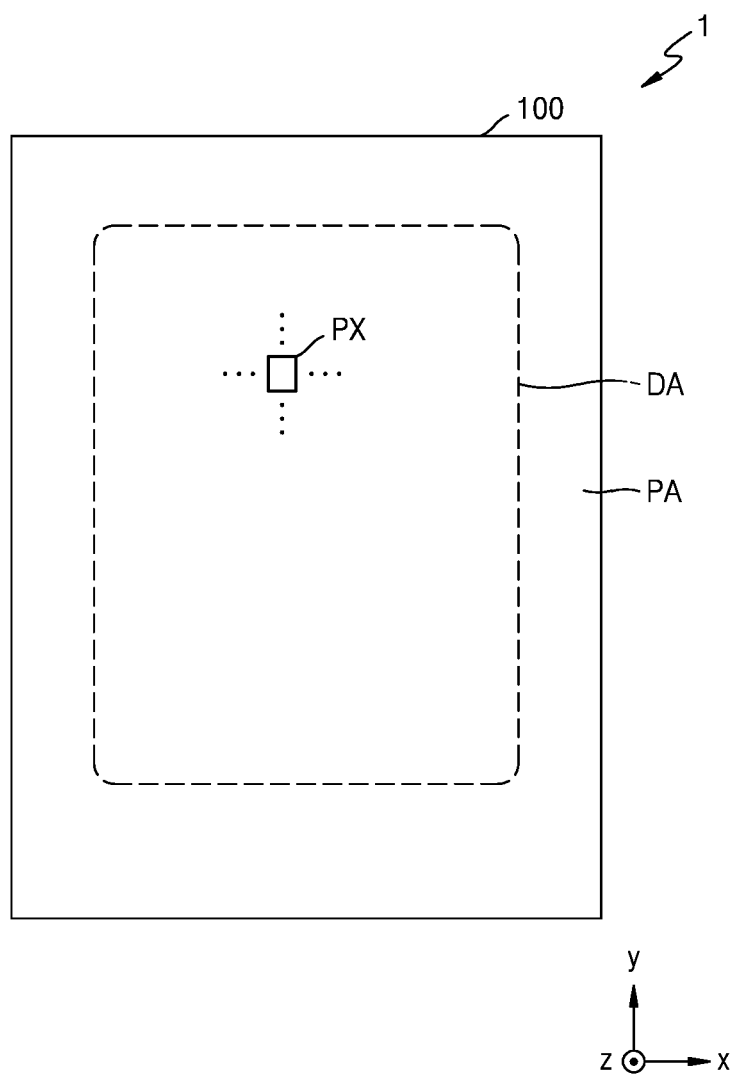
FIG. 1 is a plan view schematically illustrating a display apparatus according to an embodiment of the present disclosure.

Reference will now be made in detail to embodiments, examples of which are illustrated in the accompanying drawings, wherein like reference numerals may refer to like elements throughout the specification and the drawings. In this regard, the present embodiments may have different forms and should not necessarily be construed as being limited to the descriptions set forth herein. As used herein, the term "and/or" may include any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The effects and features of the present disclosure, and ways to achieve them will become apparent by referring to embodiments that will be described later in detail with reference to the drawings. However, the present disclosure is not necessarily limited to the following embodiments but may be embodied in various forms.

Hereinafter, embodiments of the present disclosure will be described in detail with reference to the accompanying drawings, and in the description with reference to the drawings, like reference numerals may refer to like elements and to the extent that a detailed description of an element is omitted, it may be assumed that the element is at least similar to a corresponding element that has been described elsewhere within the specification.

The terms "first", "second", etc. may be used herein to describe various elements, but these elements should not necessarily be limited by these terms.

An expression used in the singular may encompass the expression of the plural, unless it has a clearly different meaning in the context.

In the embodiments below, it will be further understood that the terms "comprise" or "have" used herein specify the presence of stated features or elements, but do not preclude the presence or addition of one or more other features or elements.

In the embodiments below, it will be understood when a portion such as a layer, an area, or an element is referred to as being "on" or "above" another portion, it can be directly on or above the other portion, or intervening portion may also be present.

It should be understood that even though a process may be described in terms of a sequence of steps, these steps are not necessarily intended to be performed in the order in which they are listed and these steps may be performed in any order or all at the same time.

In the present specification, "A and/or B" refers to A, B, or A and B. In addition, "at least one of A and B" refers to A, B, or A and B.

In the embodiments below, it will be understood when a layer, an area, or an element or the like is referred to as being "connected" to another one, it can be directly connected to the other one, or it can be indirectly connected to the other one and intervening layers, areas, elements, or the like may also be present. For example, it will also be understood that when a layer, an area, or an element or the like is referred to as being "electrically connected to" another one, it can be directly electrically connected to the other one, or it can be indirectly electrically connected to the other one and intervening layers, areas, elements, or the like may be present.

An x-axis, a y-axis, and a z-axis are not necessarily limited to three axes on a Cartesian coordinates system but may be construed as including these axes. For example, an x-axis, a y-axis, and a z-axis may be at right angles or may also indicate different directions from one another, which are not at right angles.

FIG. 1 is a plan view schematically illustrating a display apparatus according to an embodiment of the present disclosure.

Referring to FIG. 1, a display apparatus 1 includes a display area DA displaying an image and a peripheral area PA at least partially surrounding the display area DA. The display apparatus 1 may display an image to a user by using light emitted from the display area DA. Also, as the display apparatus 1 includes a substrate 100, it may be said that the substrate 100 includes the display area DA and the peripheral area PA.

The substrate 100 may include various materials such as glass, metal, or plastic. According to an embodiment of the present disclosure, the substrate 100 may include a flexible material. The flexible material may refer to a material that is easily bent and curved and is foldable or rollable to a noticeable extent without cracking or otherwise sustaining damage. The substrate 100 including a flexible material may include super-thin glass, metal, or plastic.

Pixels PX including various display elements such as an organic light-emitting diode OLED may be arranged in the display area DA of the substrate 100. The pixels PX are provided in plural, and the plurality of pixels PX may be arranged in various forms such as a stripe arrangement, a pentile arrangement, or a mosaic arrangement to realize an image.

While FIG. 1 illustrates that the display area DA has a rectangular planar shape, the display area DA may have a polygonal shape such as a triangle, a pentagon, or a hexagon, a circular shape, an oval shape, or an irregular shape or any other shape.

The peripheral area PA of the substrate 100 may include an area around the display area DA, where an image is not displayed and no display pixels are present. Various wires configured to transfer an electrical signal to be applied to the display area DA, a printed circuit board or a driver integrated circuit (IC) chip may be disposed in the peripheral area PA.

Figure 2:
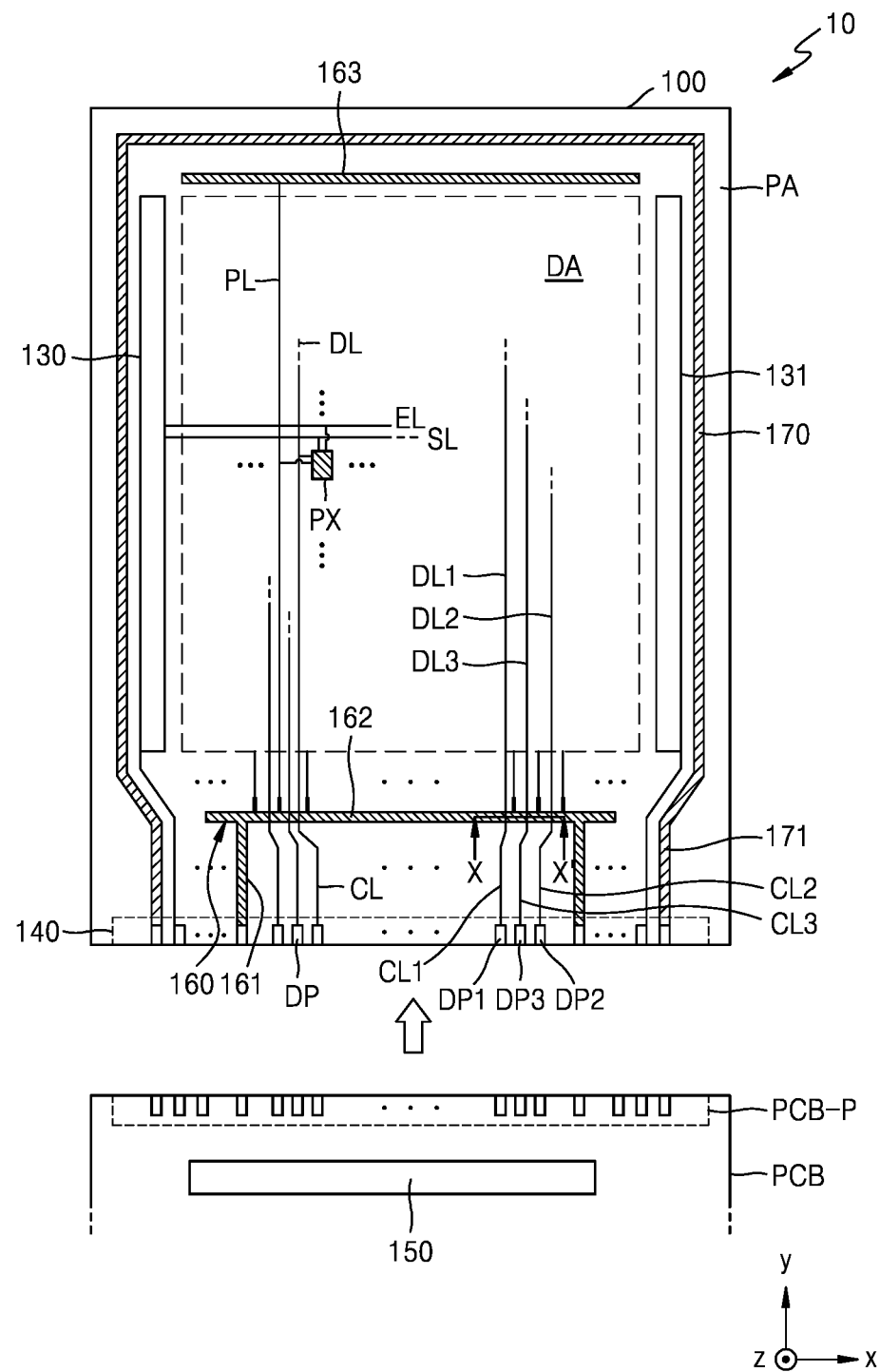
FIG. 2 is a plan view schematically illustrating a display apparatus according to an embodiment of the present disclosure.

FIG. 2 is a plan view schematically illustrating a display apparatus according to an embodiment of the present disclosure.

Referring to FIG. 2, the display apparatus 1 (see FIG. 1) may include a display panel 10, a printed circuit board PCB, and a data driving circuit 150.

The display panel 10 may include the display area DA and the peripheral area PA at least partially surrounding the display area DA. The display area DA may be covered using an encapsulation member to be protected from external air or moisture or the like.

The display panel 10 may include a plurality of pixels PX, a plurality of scan lines SL, a plurality of emission control lines EL, and a plurality of data lines DL, a plurality of power lines PL, which are arranged in the display area DA.

The pixels PX may each include a display element such as an organic light-emitting diode OLED. Each pixel PX may emit, for example, red, green, blue, or white light through the organic light-emitting diode OLED. Hereinafter, in the present specification, each pixel PX refers to a sub-pixel emitting different colors from each other, and each pixel PX may be, for example, one of a red sub-pixel, a green sub-pixel, and a blue sub-pixel.

The scan lines SL may each extend in a first direction (e.g., a ±x direction) connected to those pixels PX located in the same row from among the plurality of pixels PX. The scan lines SL may be arranged in a second direction (e.g., ±y direction). In FIG. 2, the scan lines SL are illustrated as a single wire, but alternatively, the scan lines SL may include a plurality of wires.

The emission control lines EL may each extend in the first direction (e.g., a ±x direction) connected to those pixels PX located in the same row from among the plurality of pixels PX. The emission control lines EL may be arranged in the second direction (e.g., ±y direction). In FIG. 2, the emission control lines EL are illustrated as a single wire, but alternatively, the emission control lines EL may include a plurality of wires.

The data lines DL may each extend in the second direction (e.g., the ±y direction) connected to those pixels PX located in the same column from among the plurality of pixels PX. The data lines DL may be arranged in the first direction (e.g., a ±x direction).

The power lines PL may each extend in the second direction (e.g., the ±y direction) connected to those pixels PX located in the same column from among the plurality of pixels PX. The power lines PL may be arranged in the first direction (e.g., a ±x direction).

The display panel 10 may include a first gate driving circuit 130, a second gate driving circuit 131, a first voltage supply wire 160, a second voltage supply wire 170, and a pad portion 140, which are arranged in the peripheral area PA. Each pixel PX may be electrically connected to outer circuits arranged in the peripheral area PA.

The first gate driving circuit 130 and the second gate driving circuit 131 may each include a scan driving circuit and an emission control driving circuit. The scan driving circuit may carry a scan signal to each pixel PX via the scan line SL. The emission control driving circuit may carry an emission control signal to each pixel PX via the emission control line EL.

The second gate driving circuit 131 may be arranged in parallel with the first gate driving circuit 130 with the display area DA disposed therebetween. Some of the pixels PX arranged in the display area DA may be electrically connected to the first gate driving circuit 130, and others may be electrically connected to the second gate driving circuit 131. The second gate driving circuit 131 may be omitted.

The first voltage supply wire 160 may include a first sub-wiring 162 and the second sub-wiring 163 extending in parallel in the first direction (e.g., ±x direction) with the display area DA disposed therebetween. The second voltage supply wire 170 may partially surround the display area DA in a loop shape with one side open.

The pad portion 140 may be arranged at one side of the peripheral area PA. The pad portion 140 may include a plurality of pads such as a data pad DP. The pad portion 140 might not be covered by an insulating layer but exposed and electrically connected to the printed circuit board PCB. The pads of the pad portion 140 may be electrically connected to a terminal portion PCB-P of the printed circuit board PCB. The printed circuit board PCB may transfer a signal or voltage of a controller to the display panel 10.

A control signal generated by the controller may be transferred to the first gate driving circuit 130 and the second gate driving circuit 131 through the printed circuit board PCB and the pad portion 140, respectively.

A first driving voltage ELVDD (see FIG. 3) generated by the controller may be transferred to the first voltage supply wire 160 through a first connection wiring 161 connected to the pads of the pad portion 140. The first driving voltage ELVDD may be provided to each pixel PX through the power line PL connected to the first voltage supply wire 160.

A second driving voltage ELVSS (see FIG. 3) generated by the controller may be transferred to the second voltage supply wire 170 through a second connection wiring 171 connected to the pads of the pad portion 140. The second driving voltage ELVSS may be provided to a cathode (or an opposite electrode) of a display element connected to the second voltage supply wire 170.

The data driving circuit 150 may be electrically connected to the data lines DL. A data signal (or data voltage) of the data driving circuit 150 may be carried to each pixel PX through a connection line CL connected to the data pad DP of the pad portion 140 and a data line DL connected to the connection line CL.

While the data driving circuit 150 is illustrated as being arranged on the printed circuit board PCB in FIG. 2, alternatively, the data driving circuit 150 may be arranged on the substrate 100. For example, the data driving circuit 150 may be arranged between the pad portion 140 and the first voltage supply wire 160.

As described above, the connection line CL may connect the data line DL to the data pad DP. For example, a plurality of first connection lines CL1 may connect first data lines DL1, which are some of the plurality of data lines DL, to a corresponding data pad (e.g., a first data pad DP1) from among the plurality of data pads DP. A plurality of second connection lines CL2 may connect second data lines DL2, which are some other ones among the plurality of data lines DL, to a corresponding data pad (e.g., a second data pad DP2) from among the plurality of data pads DP. A plurality of third connection lines CL3 may connect third data lines DL3, which are other ones among the plurality of data lines DL, to a corresponding data pad (e.g., a third data pad DP3) from among the plurality of data pads DP.

In an embodiment, the first connection lines CL1, the second connection lines CL2, and the third connection lines CL3 may be arranged on different layers as illustrated in FIGS. 6 to 13 which are described later. When the first connection lines CL1, the second connection lines CL2, and the third connection lines CL3 are arranged on different layers from each other, compared to when the third connection lines CL3 are arranged on a same layer as the first connection lines CL1 or the second connection lines CL2, respective widths of the first connection line CL1, the second connection lines CL2, and the third connection lines CL3 may be adjusted freely. For example, respective widths of the first connection lines CL1, the second connection lines CL2, and the third connection lines CL3 may be increased. When the respective widths of the first connection lines CL1, the second connection lines CL2, and the third connection lines CL3 are increased, respective resistances of the first connection lines CL1, the second connection lines CL2, and the third connection lines CL3 may be decreased. This will be described in further detail with reference to FIGS. 6 to 13.

Figure 3:
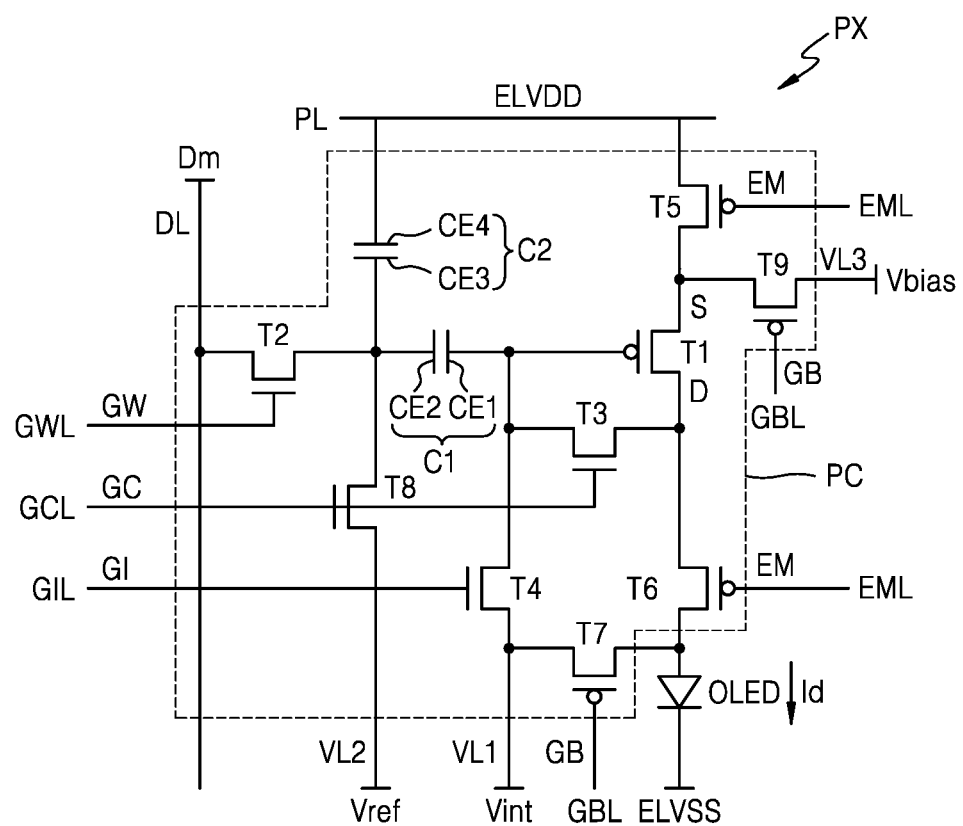
FIG. 3 is an equivalent circuit diagram illustrating a pixel arranged in a display apparatus, according to an embodiment of the present disclosure.

FIG. 3 is an equivalent circuit diagram illustrating a pixel arranged in a display apparatus, according to an embodiment of the present disclosure.

Referring to FIG. 3, one pixel PX may include a pixel circuit PC and a display element electrically connected to the pixel circuit PC. The display element may include an organic light-emitting diode OLED having an anode (or pixel electrode) and a cathode (or counter electrode).

For example, as illustrated in FIG. 3, the pixel circuit PC may include first to ninth transistors T1 to T9, a first capacitor C1, and a second capacitor C2. The first to ninth transistors T1 to T9, the first capacitor C1, and the second capacitor C2 are connected to first to fourth scan lines GWL, GCL, GIL, and GBL configured to respectively transfer first to fourth scan signals GW, GC, GI, and GB, the data line DL configured to transfer a data voltage Dm, the emission control line EML configured to transfer an emission control signal EM, the power line PL configured to transfer the first driving voltage ELVDD, a first voltage line VL1 configured to transfer an initialization voltage Vint, a second voltage line VL2 configured to transfer a reference voltage Vref, a third voltage line VL3 configured to transfer a bias voltage Vbias, and a common electrode to which the second driving voltage ELVSS is applied.

The first transistor T1 may include a driving transistor, a drain current of which is determined according to a gate-source voltage, and the second to ninth transistors T2 to T9 may include switching transistors that are turned on or off according to a gate-source voltage, substantially according to a gate voltage. The first to ninth transistors T1 to T9 may include thin-film transistors.

Some of the first to ninth transistors T1 to T9 may be n-channel metal-oxide-semiconductor field-effect transistors (MOSFETs) (NMOS), and the others may be p-channel MOSFETs (PMOS). For example, as illustrated in FIG. 3, from among the first to ninth transistors T1 to T9, the second transistor T2, the third transistor T3, the fourth transistor T4, and the eighth transistor T8 may be NMOS, and the others may be PMOS. Alternatively, from among the first to ninth transistors T1 to T9, the third transistor T3, the fourth transistor T4, and the eighth transistor T8 may be NMOS, and the others may be PMOS.

One of the first to ninth transistors T1 to T9 may be NMOS, and the others may be PMOS. Alternatively, all of the first to ninth transistors T1 to T9 may be NMOS or PMOS.

The first capacitor C1 and the second capacitor C2 are connected between the power line PL and a gate of the first transistor T1. The first capacitor C1 may have a first lower electrode CE1 connected to the gate of the first transistor T1 and a first upper electrode CE2 connected to a second lower electrode CE3 of the second capacitor C2. The second capacitor C2 may have the second lower electrode CE3 connected to the first upper electrode CE2 of the first capacitor C1 and a second upper electrode CE4 connected to the power line PL.

Figure 4:
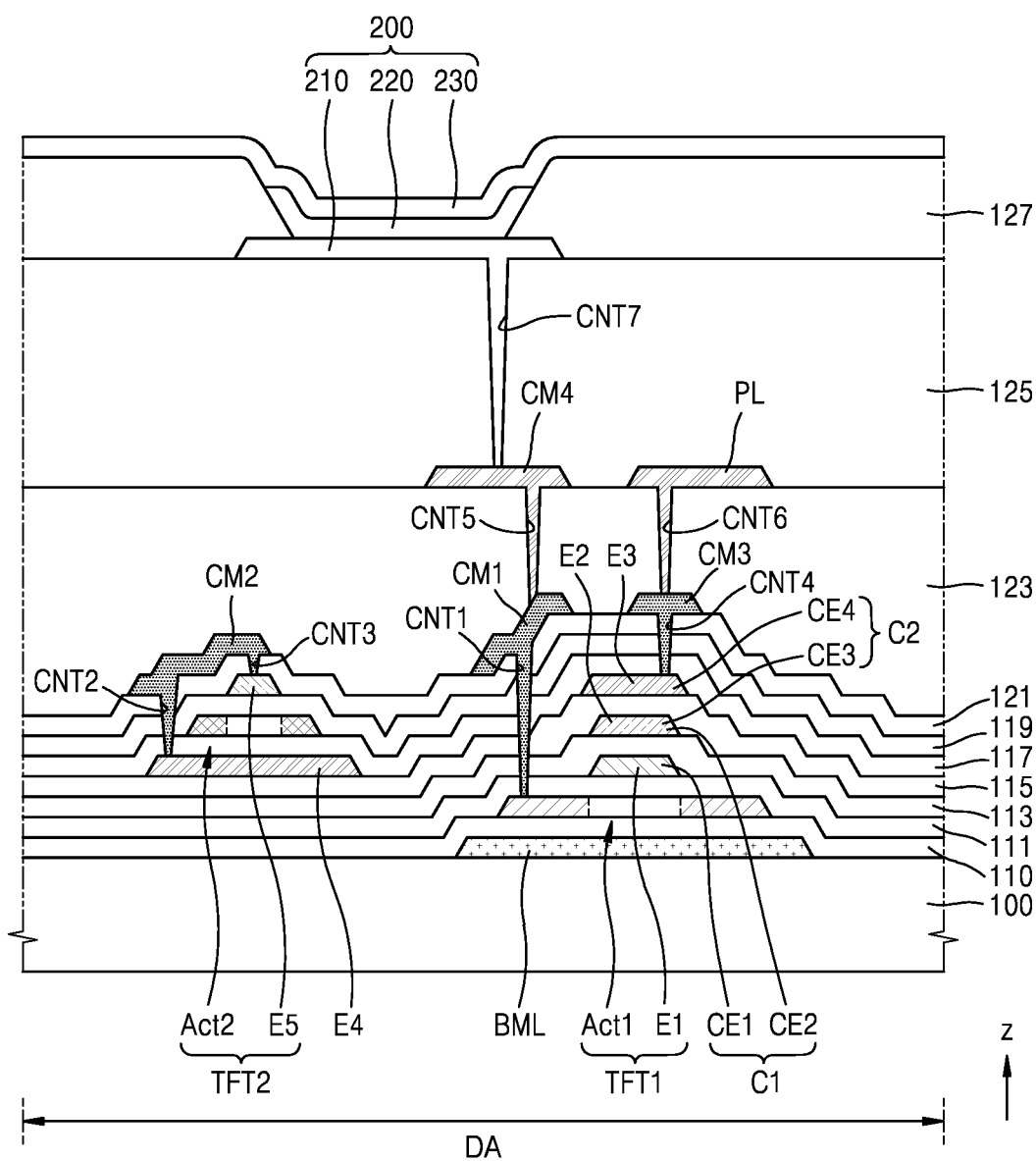
FIG. 4 is a cross-sectional view schematically illustrating a portion of a pixel, according to an embodiment of the present disclosure.

As illustrated in FIG. 4, the first capacitor C1 and the second capacitor C2 may at least partially overlap each other. For example, the first upper electrode CE2 of the first capacitor C1 may function as the second lower electrode CE3 of the second capacitor C2. For example, the second lower electrode CE3 of the second capacitor C2 may function as the first upper electrode CE2 of the first capacitor C1.

Referring back to FIG. 3, the first transistor T1 may control the magnitude of a driving current Id flowing from the power line PL to the organic light-emitting diode OLED according to the gate-source voltage. The first transistor T1 may have the gate connected to the first lower electrode CE1 of the first capacitor C1, a source connected to the power line PL through the fifth transistor T5, and a drain connected to the organic light-emitting diode OLED through the sixth transistor T6.

The first transistor T1 may output the driving current Id to the organic light-emitting diode OLED according to the gate-source voltage. The magnitude of the driving current Id is determined based on a difference between the gate-source voltage of the first transistor T1 and a threshold voltage. The organic light-emitting diode OLED may receive the driving current Id from the first transistor T1 and emit light with a brightness according to the magnitude of the driving current Id.

The second transistor T2 may connect the data line DL to the first upper electrode CE2 of the first capacitor C1 (or the second lower electrode CE3 of the second capacitor C2) in response to the first scan signal GW. The second transistor T2 may transfer the data voltage Dm to the first upper electrode CE2 of the first capacitor C1 (or the second lower electrode CE3 of the second capacitor C2) in response to the first scan signal GW.

The third transistor T3 may connect the drain and the gate of the first transistor T1 to each other in response to the second scan signal GC. The third transistor T3 may be connected in series between the drain and the gate of the first transistor T1.

The fourth transistor T4 may connect the first voltage line VL1 to the gate of the first transistor T1, in response to the third scan signal GI. The fourth transistor T4 may apply the initialization voltage Vint to the gate of the first transistor T1 in response to the third scan signal GI.

The fifth transistor T5 may connect the power line PL to the source of the first transistor T1 in response to the emission control signal EM. The fifth transistor T5 may connect the power line PL and the source of the first transistor T1 to each other in response to the emission control signal EM.

The sixth transistor T6 may connect the drain of the first transistor T1 to the anode of the organic light-emitting diode OLED in response to the emission control signal EM. The sixth transistor T6 may connect the drain of the first transistor T1 and the anode of the organic light-emitting diode OLED to each other in response to the emission control signal EM.

While the fifth transistor T5 and the sixth transistor T6 are illustrated as operating in response to the same light emission control signal EM, in an embodiment of the present disclosure, the fifth transistor T5 and the sixth transistor T6 may operate in response to different light emission control signals, respectively. For example, the fifth transistor T5 may have a gate connected to a first emission control line and may connect the power line PL to the source of the first transistor T1 in response to a first emission control signal. The sixth transistor T6 may have a gate connected to a second emission control line and may connect the drain of the first transistor T1 to the anode of the organic light-emitting diode OLED in response to a second emission control signal.

The seventh transistor T7 may connect the first voltage line VL1 to the anode of the organic light-emitting diode OLED in response to the fourth scan signal GB. The seventh transistor T7 may apply the initialization voltage Vint to the anode of the organic light-emitting diode OLED in response to the fourth scan signal GB.

The eighth transistor T8 may connect the second voltage line VL2 to the first upper electrode CE2 of the first capacitor C1 (or the second lower electrode CE3 of the second capacitor C2) in response to the second scan signal GC. The eighth transistor T8 may apply the reference voltage Vref to the first upper electrode CE2 of the first capacitor C1 (or the second lower electrode CE3 of the second capacitor C2) in response to the second scan signal GC.

While the third transistor T3 and the eighth transistor T8 are illustrated as operating in response to the same second scan signal GC in FIG. 3, in an embodiment of the present disclosure, the third transistor T3 and the eighth transistor T8 may operate in response to different scan signals, respectively.

The ninth transistor T9 may connect the third voltage line VL3 to the source of the first transistor T1 in response to the fourth scan signal GB. The ninth transistor T9 may apply the bias voltage Vbias to the source of the first transistor T1 in response to the fourth scan signal GB.

While the seventh transistor T7 and the ninth transistor T9 are illustrated as operating in response to the same fourth scan signal GB, in an embodiment of the present disclosure, the seventh transistor T7 and the ninth transistor T9 may operate in response to different scan signals, respectively.

The second scan signal GC may be substantially synchronized with the first scan signal GW. The third scan signal GI may be substantially synchronized with the first scan signal GW of a previous row. The fourth scan signal GB may be substantially synchronized with the first scan signal GW. According to an example embodiment of the present disclosure, the fourth scan signal GB may be substantially synchronized with the first scan signal GW of a next row or the third scan signal GI of a next row.

In an embodiment, the first to ninth transistors T1 to T9 may include a semiconductor layer including silicon. For example, the first to ninth transistors T1 to T9 may include a semiconductor layer including low temperature polysilicon (LTPS). A polysilicon material has high electron mobility (100 cm$^2$/Vs or more), and thus has low energy consumption and excellent reliability.

For example, semiconductor layers of the first to ninth transistors T1 to T9 may include an oxide of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce) and/or zinc (Zn). For example, the semiconductor layers may include an InSnZnO (ITZO) semiconductor layer, an InGaZnO (IGZO) semiconductor layer, or the like.

For example, some semiconductor layers from among the first to ninth transistors T1 to T9 may include LTPS, and some other semiconductor layers may include an oxide semiconductor (e.g., IGZO).

FIG. 4 is a cross-sectional view schematically illustrating a portion of a pixel, according to an embodiment of the present disclosure. FIG. 4 is an exemplary cross-sectional view of a portion of a pixel according to an embodiment of the present disclosure, and to the extent that a detailed description of an element is omitted, it may be assumed that the element is at least similar to a corresponding element that has been described elsewhere within the specification.

Referring to FIG. 4, a first thin-film transistor TFT1, a second thin-film transistor TFT2, a first capacitor C1, and a second capacitor C2 may be arranged in the display area DA. The first thin-film transistor TFT1 may correspond to the first transistor T1 of FIG. 3, and the second thin-film transistor TFT2 corresponds to the second transistor T2, the third transistor T3, the fourth transistor T4 or the eighth transistor T8 of FIG. 3.

The first thin-film transistor TFT1 may include a first semiconductor layer Act1 and a first electrode E1 that at least partially overlaps the first semiconductor layer Act1. The first electrode E1 corresponds to a gate (or a gate electrode) of the first thin-film transistor TFT1.

The second thin-film transistor TFT2 may include a second semiconductor layer Act2 and a fifth electrode E5 that at least partially overlaps the second semiconductor layer Act2. The fifth electrode E5 corresponds to a gate (or gate electrode) of the second thin-film transistor TFT2. The second thin-film transistor TFT2 may be arranged over the first thin-film transistor TFT1.

In an embodiment, a conductivity type of the first thin-film transistor TFT1 may be opposite to a conductivity type of the second thin-film transistor TFT2. For example, the first thin-film transistor TFT1 may be a PMOS, and the second thin-film transistor TFT2 may be NMOS.

In an embodiment, the first semiconductor layer Act1 of the first thin-film transistor TFT1 and the second semiconductor layer Act2 of the second thin-film transistor TFT2 may include different materials from each other. For example, the first semiconductor layer Act1 may include a silicon semiconductor material, and the second semiconductor layer Act2 may include an oxide semiconductor material.

The first capacitor C1 may include a first electrode E1 and a second electrode E2 that at least partially overlaps the first electrode E1. The first capacitor C1 may at least partially overlap the first thin-film transistor TFT1. For example, the first electrode E1 may function as the first lower electrode CE1 of the first capacitor C1. For example, the first electrode E1 may correspond to the first lower electrode CE1 of the first capacitor C1.

The second capacitor C2 may include a second electrode E2 and a third electrode E3 that at least partially overlaps the second electrode E2. The second capacitor C2 may at least partially overlap the first capacitor C1. For example, the second electrode E2 may function as the first upper electrode CE2 of the first capacitor C1 and function as the second lower electrode CE3 of the second capacitor C2. For example, the second electrode E2 may correspond to the first upper electrode CE2 of the first capacitor C1 and may correspond to the second lower electrode CE3 of the second capacitor C2.

As in an embodiment of the present disclosure, when the first capacitor C1 and the second capacitor C2 overlap each other in a ±z direction (e.g., the depth direction), the number of pixels that may be arranged in a xy plane may be increased compared to when the first capacitor C1 and the second capacitor C2 do not overlap each other and are provided separately. As the number of pixels arranged on the xy plane per unit area may be increased, a resolution of the display apparatus may be increased. The resolution of the display apparatus may be increased.

While FIG. 4 illustrates that a width of the first electrode E1 and a width of the second electrode E2 are the same, and a width of the second electrode E2 and a width of the third electrode E3 are different from each other, but this is only an example and various other modifications may be made.

Hereinafter, elements included in the display apparatus will be described in further detail according to a stack structure.

The substrate 100 may include a glass material, a ceramic material, a metal material, or a flexible or bendable material. When the substrate 100 has flexible or bendable characteristics, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate or cellulose acetate propionate.

The substrate 100 may have a single-layer or multi-layer structure of the material, and when substrate 100 has a multi-layer structure, an inorganic layer may be further included. In some embodiments, the substrate 100 may have an organic material/inorganic material/organic material structure.

A barrier layer may be further disposed between the substrate 100 and a buffer layer 110. The barrier layer may have a function of preventing or minimizing penetration of impurities from the substrate 100 or the like into the first semiconductor layer Act1 and the second semiconductor layer Act2. The barrier layer may include an inorganic material such as an oxide or nitride, an organic material, or an organic-inorganic composite material, and may have a single-layer or multi-layer structure of an inorganic material and an organic material.

A bottom metal layer BML may be between the substrate 100 and the buffer layer 110. The bottom metal layer BML may include a conductive material including molybdenum (Mo), aluminum (Al), copper (Cu), titanium (Ti), and/or the like, and may have a multi-layer or single-layer structure including the above material.

The bottom metal layer BML may at least partially overlap the first semiconductor layer Act1. The bottom metal layer BML may have a function of protecting the first semiconductor layer Act1. The bottom metal layer BML may receive an arbitrary (or preset) voltage. Through the bottom metal layer BML to which an arbitrary voltage is applied, when driving a pixel circuit including an NMOS and a PMOS through the bottom metal layer BML, to which an arbitrary voltage is applied, accumulation of unnecessary charges in the first semiconductor layer Act1 may be prevented. As a result, characteristics of the first thin-film transistor TFT1 including the first semiconductor layer Act1 may be maintained stably.

The first semiconductor layer Act1 may be arranged on the buffer layer 110. The first semiconductor layer Act1 may include amorphous silicon or polysilicon. The first semiconductor layer Act1 may include a channel region, a source region, and a drain region arranged on opposite sides of the channel region. The source region and the drain region may be regions doped by adding a dopant. The first semiconductor layer Act1 may include a single layer or multiple layers.

A first insulating layer 111 and a second insulating layer 113 may be stacked on the substrate 100 to cover the first semiconductor layer Act1. The first insulating layer 111 and the second insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. Zinc oxide ($ZnO_x$) may include zinc oxide (ZnO) and/or zinc peroxide ($ZnO_2$).

The first electrode E1 may be arranged on the first insulating layer 111. The first electrode E1 may include a conductive material including molybdenum (Mo), aluminum (Al), copper (Cu), titanium (Ti), and the like, and may have a multi-layer or single-layer structure including the above material.

The second electrode E2 may be arranged on the second insulating layer 113. The second electrode E2 may include a conductive material including molybdenum (Mo), aluminum (Al), copper (Cu), and/or titanium (Ti), and the like, and may have a multi-layer or single-layer structure including the above material.

The first electrode E1 and the second electrode E2 overlap each other with the second insulating layer 113 therebetween, and form capacitance. Here, the second insulating layer 113 may act as a dielectric layer of the first capacitor C1.

A third insulating layer 115 may arranged on the second insulating layer 113 to cover the second electrode E2. The third insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. Zinc oxide ($ZnO_x$) may include zinc oxide (ZnO) and/or zinc peroxide ($ZnO_2$).

A third electrode E3 and a fourth electrode E4 may be arranged on the third insulating layer 115. The third electrode E3 and the fourth electrode E4 may include a conductive material including molybdenum (Mo), aluminum (Al), copper (Cu), and/or titanium (Ti), and the like, and may have a multi-layer or single-layer structure including the above material.

The second electrode E2 and the third electrode E3 overlap each other with the third insulating layer 115 disposed therebetween, and this structure may form capacitance. Here, the third insulating layer 115 may act as a dielectric layer of the second capacitor C2.

The fourth electrode E4 may at least partially overlap the second semiconductor layer Act2. The fourth electrode E4 may have a function of protecting the second semiconductor layer Act2. The fourth electrode E4 may be electrically connected to the fifth electrode E5 through a second connection electrode CM2 described later.

In FIG. 4, the fourth electrode E4 is illustrated as being arranged on the same layer as the third electrode E3. Alternatively, the fourth electrode E4 may be arranged on the same layer as the second electrode E2. This will be described later with reference to FIG. 5.

A fourth insulating layer 117 may be arranged on the third insulating layer 115 to cover the third electrode E3 and the fourth electrode E4. The fourth insulating layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. Zinc oxide ($ZnO_x$) may include zinc oxide (ZnO) and/or zinc peroxide ($ZnO_2$).

The second semiconductor layer Act2 may be arranged on the fourth insulating layer 117. The second semiconductor layer Act2 may include an oxide semiconductor material. The second semiconductor layer Act2 may include an oxide such as indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and/or zinc (Zn).

For example, the second semiconductor layer Act2 may include an ITZO semiconductor layer, an IGZO semiconductor layer, or the like. An oxide semiconductor has a wide band gap (about 3.1 eV), and thus high carrier mobility and a low leakage current, and accordingly the voltage drop thereof is not large despite a long driving time, and thus, the luminance thereof according to the voltage drop is not changed greatly even during low-frequency driving.

The second semiconductor layer Act2 may include a channel region, a source region, and a drain region arranged on opposite sides of the channel region. The second semiconductor layer Act2 may include a single layer or multiple layers.

As described above, the fourth electrode E4 may be arranged under the second semiconductor layer Act2. The second semiconductor layer Act2 including an oxide semiconductor material is vulnerable to light, and thus, the second semiconductor layer Act2 may be protected through the fourth electrode E4. The fourth electrode E4 may have a function of preventing a change in device characteristics of the second thin-film transistor TFT2 including an oxide semiconductor, as a photocurrent is induced in the second semiconductor layer Act2 by external light incident from the side of the substrate 100.

A fifth insulating layer 119 may be arranged on the second semiconductor layer Act2. The fifth insulating layer 119 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. Zinc oxide ($ZnO_x$) may include zinc oxide (ZnO) and/or zinc peroxide ($ZnO_2$).

While FIG. 4 illustrates that the fifth insulating layer 119 is arranged on the entire surface of the substrate 100 to cover the second semiconductor layer Act2, in an embodiment of the present disclosure, the fifth insulating layer 119 may be patterned to overlap a portion of the second semiconductor layer Act2. For example, the fifth insulating layer 119 may be patterned to overlap the channel region of the second semiconductor layer Act2.

The fifth electrode E5 may be arranged on the fifth insulating layer 119. The fifth electrode E5 may include a conductive material including molybdenum (Mo), aluminum (Al), copper (Cu), and/or titanium (Ti), and the like, and may have a multi-layer or single-layer structure including the above material.

A sixth insulating layer 121 may arranged on the fifth insulating layer 119 to cover the fifth electrode E5. The sixth insulating layer 121 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. Zinc oxide ($ZnO_x$) may include zinc oxide (ZnO) and/or zinc peroxide ($ZnO_2$).

A first connection electrode CM1, the second connection electrode CM2, and a third connection electrode CM3 may be arranged on the sixth insulating layer 121. The first connection electrode CM1, the second connection electrode CM2, and the third connection electrode CM3 may include a conductive material including molybdenum (Mo), aluminum (Al), copper (Cu), and/or titanium (Ti), and the like, and include a multi-layer or single layer structure including the above material. For example, the first connection electrode CM1, the second connection electrode CM2, and the third connection electrode CM3 may have a multi-layer structure of Ti/Al/Ti.

The first connection electrode CM1 may be connected to the first semiconductor layer Act1 through a first contact hole CNT1 formed in the first to sixth insulating layers 111, 113, 115, 117, 119, and 121. A portion of the first connection electrode CM1 may be buried in the first contact hole CNT1, and the first connection electrode CM1 and the first semiconductor layer Act1 may be connected to each other.

The second connection electrode CM2 may be connected to the fourth electrode E4 through a second contact hole CNT2 formed in the fourth to sixth insulating layers 117, 119, and 121. A portion of the second connection electrode CM2 may be buried in the second contact hole CNT2, and the second connection electrode CM2 and the fourth electrode E4 may be connected to each other. The second connection electrode CM2 may be connected to the fifth electrode E5 through a third contact hole CNT3 formed in the sixth insulating layer 121. A portion of the second connection electrode CM2 may be buried in the third contact hole CNT3, and the third connection electrode CM3 and the fifth electrode E5 may be connected to each other. The second connection electrode CM2 may act as a bridge connecting the fourth electrode E4 to the fifth electrode E5.

The third connection electrode CM3 may be connected to the third electrode E3 through a fourth contact hole CNT4 formed in the fourth to sixth insulating layers 117, 119, and 121. A portion of the third connection electrode CM3 may be buried in the fourth contact hole CNT4, and the third connection electrode CM3 and the third electrode E3 may be connected to each other.

A first planarization layer 123 and a second planarization layer 125 may be stacked on the sixth insulating layer 121. The first planarization layer 123 and the second planarization layer 125 may be formed as a single layer or a multilayer structure including an organic material and may provide a flat upper surface. The first planarization layer 123 and the second planarization layer 125 may include general-purpose polymers such as benzocyclobutene (BCB), polyimide, hexamethyldisiloxane (HMDSO), polymethylmethacrylate (PMMA) or polystyrene (PS), a polymer derivative having a phenolic group, acrylic polymer, imide-based polymer, arylether-based polymer, amide-based polymer, fluorine-based polymer, p-xylene-based polymer, vinyl alcohol-based polymer, or a blend thereof.

A fourth connection electrode CM4 and the power line PL may be arranged on the first planarization layer 123. The fourth connection electrode CM4 and the power line PL may include a conductive material including molybdenum (Mo), aluminum (Al), copper (Cu), titanium (Ti), and the like, and may have a multi-layer or single-layer structure including the above material. For example, the fourth connection electrode CM4 and the power line PL may have a multi-layer structure of Ti/Al/Ti.

The fourth connection electrode CM4 may be connected to the first connection electrode CM1 through a fifth contact hole CNT5 formed in the first planarization layer 123. A portion of the fourth connection electrode CM4 may be buried in the fifth contact hole CNT5, and the fourth connection electrode CM4 and the first connection electrode CM1 may be connected to each other. The fourth connection electrode CM4 may be connected to the first semiconductor layer Act1 through the first connection electrode CM1.

The power line PL may be connected to the third connection electrode CM3 through a sixth contact hole CNT6 formed in the first planarization layer 123. A portion of the power line PL may be buried in the sixth contact hole CNT6, and the power line PL and the third connection electrode CM3 may be connected to each other. The power line PL may be connected to the third electrode E3 through the third connection electrode CM3.

A display element 200 may be arranged on the second planarization layer 125. The display element 200 may include a pixel electrode 210, an intermediate layer 220 including an organic emission layer, and an opposite electrode 230.

The pixel electrode 210 may include a transmissive or semi-transmissive electrode or a reflective electrode. In some embodiments, the pixel electrode 210 may include a reflective layer including Ag, Mg, Al, Pt, Pd, Au, Ni, Nd, Ir, Cr, and a compound thereof, and a transparent or semi-transparent electrode layer formed on the reflective layer. The transparent or semi-transparent electrode layer may include indium tin oxide (ITO), indium zinc oxide (IZO), zinc oxide (ZnO), indium oxide ($In_2O_3$), indium gallium oxide (IGO) and/or aluminum zinc oxide (AZO). In some embodiments, the pixel electrode 210 may have an ITO/Ag/ITO structure.

The pixel electrode 210 may be connected to the fourth connection electrode CM4 through the sixth contact hole CNT6 formed in the second planarization layer 125. A portion of the pixel electrode 210 may be buried in the sixth contact hole CNT6, and the pixel electrode 210 and the fourth connection electrode CM4 may be connected to each other. The pixel electrode 210 may be electrically connected to the first semiconductor layer Act1 through the fourth connection electrode CM4 and the first connection electrode CM1.

A pixel defining layer 127 may be arranged on the second planarization layer 125. The pixel defining layer 127 may increase a distance between the edges of the pixel electrode 210 and the opposite electrode 230 above the pixel electrode 210 to thereby prevent arcing of electricity, or the like, at the edges of the pixel electrode 210.

The pixel defining layer 127 may include at least one organic insulating material such as polyimide, polyamide, acrylic resin, BCB, and/or phenol resin, and may be formed by spin coating or the like. The pixel defining layer 127 may include an organic insulating material. Alternatively, the pixel defining layer 127 may include an inorganic insulating material such as silicon nitride, silicon oxynitride, and/or silicon oxide. Alternatively, the pixel defining layer 127 may include an organic insulating material and an inorganic insulating material. In some embodiments, the pixel defining layer 127 may include a light-blocking material and may be black. The light-blocking material may include carbon black, carbon nanotubes, a resin or paste containing a black dye, metal particles such as nickel, aluminum, molybdenum and alloys thereof, metal oxide particles (e.g., chromium oxide), or metal nitride particles (e.g., chromium nitride) and the like. When the pixel defining layer 127 includes a light-blocking material, reflection of external light by metal structures arranged below the pixel defining layer 127 may be reduced.

The intermediate layer 220 may be arranged in an opening formed by the pixel defining layer 127. The intermediate layer 220 may include an organic emission layer. The organic emission layer may include an organic material including a fluorescent or phosphorescent material, which emit red, green, blue, or white light. The organic emission layer may include a low molecular weight organic material or a polymer organic material, and functional layers such as a hole transport layer (HTL), a hole injection layer (HIL), an electron transport layer (ETL), or an electron injection layer (EIL) may be selectively further arranged below and above the organic emission layer.

The intermediate layer 220 may be arranged to correspond to each of a plurality of pixel electrodes 210. However, the present disclosure is not necessarily limited thereto. Various modifications may be made to the intermediate layer 220; for example, the intermediate layer 220 may include a single layer over the plurality of pixel electrodes 210.

The opposite electrode 230 may include a transmissive electrode or a reflective electrode. In some embodiments, the opposite electrode 230 may include a transparent or semi-transparent electrode and may include a metal thin-film having a small work function and including Li, Ca, LiF/Ca, LiF/Al, Al, Ag, Mg, and compounds thereof. As understood herein, a small work function is understood to be any work function that is equal to or smaller than the work function of the aforementioned substances. Also, a transparent conductive oxide (TCO) layer such as ITO, IZO, ZnO or $In_2O_3$ may be further arranged on the metal thin-film. The opposite electrode 230 may be arranged over the display area DA, and may be arranged on the intermediate layer 220 and the pixel defining layer 127. The opposite electrode 230 may be formed integrally with respect to a plurality of display elements 200 to correspond to the plurality of pixel electrodes 210.

The display element 200 may be covered by an encapsulation layer. The encapsulation layer may include at least one organic encapsulation layer and at least one inorganic encapsulation layer. The at least one inorganic encapsulation layer may include aluminum oxide, titanium oxide, tantalum oxide, hafnium oxide, zinc oxide, silicon oxide, silicon nitride, and/or silicon oxynitride. The at least one inorganic encapsulation layer may include a single layer or multiple layers including the above-described material. The at least one organic encapsulation layer may include a polymer-based material. The polymer-based material may include polymethyl methacrylate, an acrylic resin such as polyacrylic acid, an epoxy resin, polyimide, polyethylene, and the like. In an embodiment, the at least one organic encapsulation layer may include an acrylate polymer.

While the first to sixth insulating layers 111, 113, 115, 117, 119, and 121 are illustrated as each having the same thickness in FIG. 4, this is merely an example and various other modifications may be made.

Figure 5:
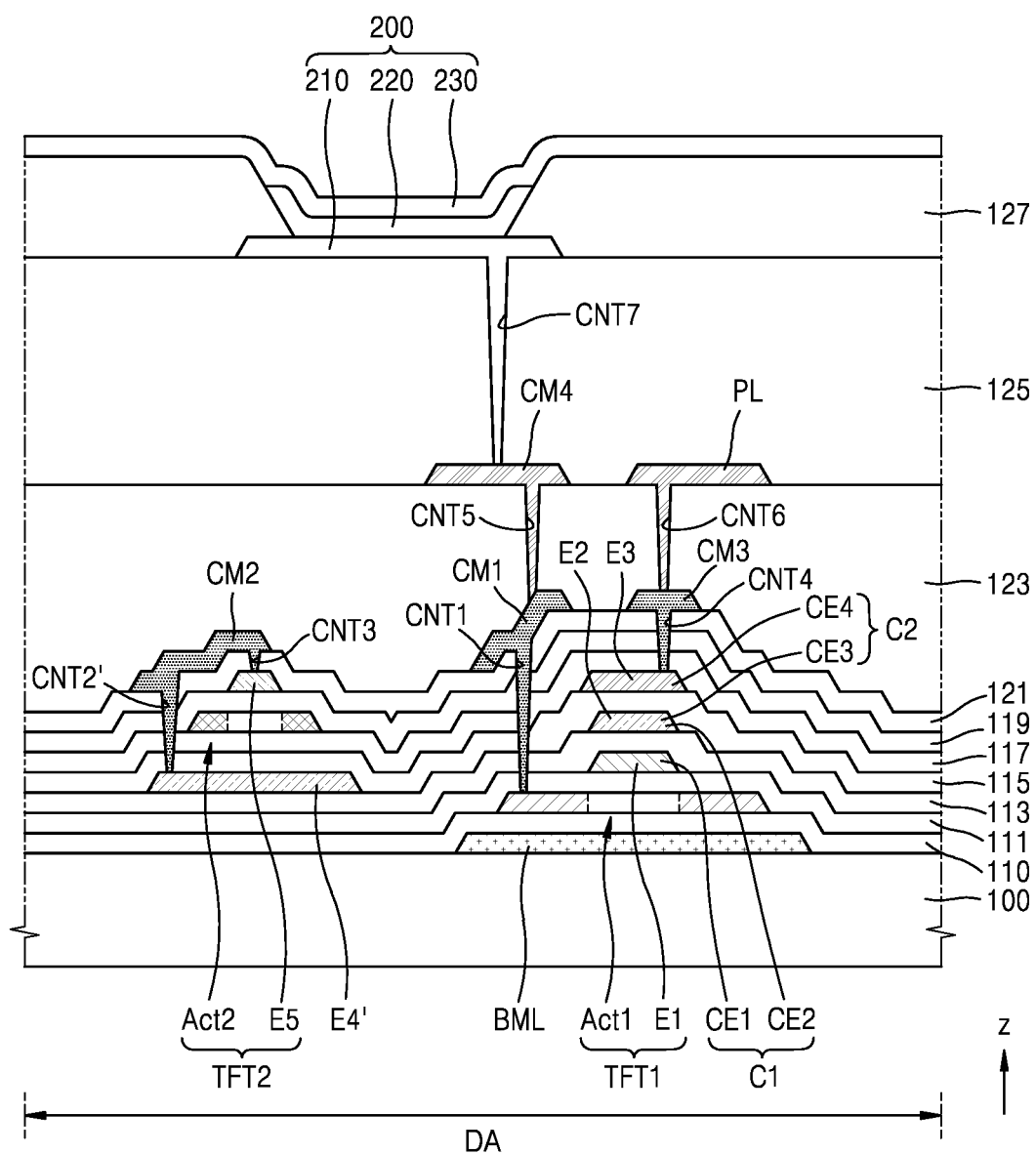
FIG. 5 is a cross-sectional view schematically illustrating a portion of a pixel, according to an embodiment of the present disclosure.

FIG. 5 is a cross-sectional view schematically illustrating a portion of a pixel, according to an embodiment of the present disclosure. FIG. 5 is a modified embodiment of FIG. 4, and there is a difference in the structure of a fourth electrode. Hereinafter, for repeated details, the description provided with reference to FIG. 4 will be referred to, and description will focus on differences.

Referring to FIG. 5, a fourth electrode E4' may be arranged on the second insulating layer 113. The fourth electrode E4' may be arranged on the same layer as the second electrode E2.

The second connection electrode CM2 may be connected to the fourth electrode E4' through a second contact hole CNT2' formed in the third to sixth insulating layers 115, 117, 119, and 121. A portion of the second connection electrode CM2 may be buried in the second contact hole CNT2', and the second connection electrode CM2 and the fourth electrode E4' may be connected to each other.

In an embodiment, the first to fourth contact holes CNT1, CNT2, CNT3, and CNT4 might not be formed at the same time. For example, after forming the first contact hole CNT1 and the second contact hole CNT2', the third contact hole CNT3 and the fourth contact hole CNT4 may be formed. A depth of each of the first contact hole CNT1 and the second contact hole CNT2' may be greater than a depth of each of the third contact hole CNT3 and the fourth contact hole CNT4. When contact holes having different depths are simultaneously formed, a surface of a conductive layer exposed by contact holes having a relatively small depth may be damaged. However, when the contact holes having different depths are separately formed, instead of forming the same at the same time as in the embodiment, damage to the surface of the conductive layer exposed by the contact holes may be prevented.

Figure 6:
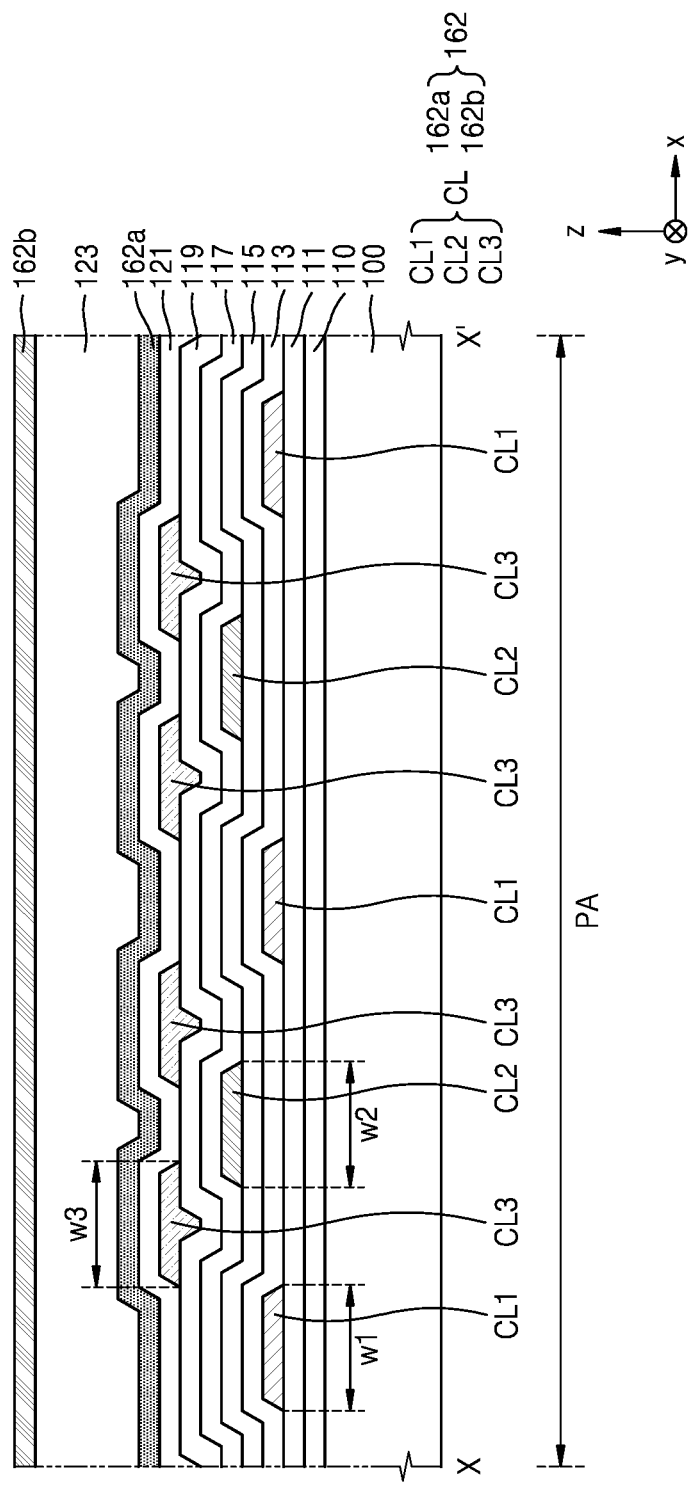
FIG. 6 is a cross-sectional view schematically illustrating connection lines according to an embodiment of the present disclosure.

FIG. 6 is a cross-sectional view schematically illustrating connection lines according to an embodiment of the present disclosure. In detail, FIG. 6 is a cross-sectional view of a portion of the display panel 10 of FIG. 2 cut along line X-X', and some members may be omitted therein. In FIG. 6, like reference numerals as those of FIG. 4 may denote like elements, and thus, to the extent that a detailed description of an element is omitted, it may be assumed that the element is at least similar to a corresponding element that has been described elsewhere within the specification.

Referring to FIG. 6, a plurality of connection lines CL and the first sub-wiring 162 may be arranged in the peripheral area PA.

The plurality of connection lines CL may connect the plurality of data lines DL to a corresponding data pad DP among the plurality of data pads DP of the pad portion 140 as described above with reference to FIG. 2. For example, the plurality of connection lines CL may include the first connection lines CL1, the second connection lines CL2, and the third connection lines CL3. The first connection lines CL1 may connect the first data lines DL1, which are some of the plurality of data lines DL, to a corresponding data pad (e.g., the first data pad DP1) from among the plurality of data pads DP. The second connection lines CL2 may connect the second data lines DL2, which are some others among the plurality of data lines DL, to a corresponding data pad (e.g., the second data pad DP2) from among the plurality of data pads DP. The third connection lines CL3 may connect the third data lines DL3, which are some others among the plurality of data lines DL, to a corresponding data pad (e.g., the third data pad DP3) from among the plurality of data pads DP.

In an embodiment, the plurality of first connection lines CL1 and the plurality of second connection lines CL2 may be arranged between two third connection lines CL3 that are adjacent to each other in the first direction (e.g., ±x direction) from among the third connection lines CL3. The plurality of first connection lines CL1 and the plurality of second connection lines CL2 may be alternately arranged in the first direction (e.g., the ±x direction).

In an embodiment, the number of third connection lines CL3 per unit area may be greater than the number of first connection lines CL1 per unit area. The number of third connection lines CL3 per unit area may be greater than the number of second connection lines CL2 per unit area.

In an embodiment, the number of first connection lines CL1 per unit area may be the same as the number of second connection lines CL2 per unit area.

In an embodiment, the first connection lines CL1, the second connection lines CL2, and the third connection lines CL3 may be arranged on different layers from each other. For example, the second connection lines CL2 may be arranged over the first connection lines CL1, and the third connection lines CL3 may be arranged over the second connection lines CL2. As illustrated in FIG. 6, the first connection lines CL1 may be arranged on the first insulating layer 111, the second connection lines CL2 may be arranged on the third insulating layer 115, and the third connection lines CL3 may be arranged on the fifth insulating layer 119. For example, the first connection lines CL1 may be arranged on the same layer as the first electrode E1 (see FIG. 4), and the second connection lines CL2 may be arranged on the same layer as the third electrode E3 (see FIG. 4), and the third connection lines CL3 may be arranged on the same layer as the fourth electrode E4 (refer to FIG. 4).

While FIG. 6 illustrates that the first connection lines CL1 are arranged on the same layer as the first electrode E1, the second connection lines CL2 are arranged on the same layer as the third electrode E3, and the third connection lines CL3 are arranged on the same layer as the fourth electrode E4, this is only an example and various modifications may be made. This will be described in further detail with reference to FIGS. 9 to 13.

In addition, although FIG. 6 illustrates that the second connection lines CL2 and the third connection lines CL3 at least partially overlap each other, in an embodiment of the present disclosure, the second connection lines CL2 and the third connection lines CL3 might not overlap each other. Alternatively, the first connection lines CL1 and the third connection lines CL3 may at least partially overlap each other. Alternatively, the first connection lines CL1 and the third connection lines CL3 might not overlap each other.

When the first connection lines CL1, the second connection lines CL2, and the third connection lines CL3 are arranged on different layers as in an embodiment of the present disclosure, the number of connection lines CL arranged on each layer may be reduced compared to when the third connection lines CL3 are arranged on the same layer as the first connection lines CL1 or the second connection lines CL2. When the connection lines CL are arranged on three different layers, the number of connection lines CL arranged on each layer may be reduced. As the number of connection lines CL arranged on each layer is reduced, a width of each of the connection lines CL may be freely changed. For example, the width of each of the connection lines CL may be increased. When a first width w1 of each of the first connection lines CL1 arranged between the first insulating layer 111 and the second insulating layer 113 is increased, the resistance of each of the first connection lines CL1 may be decreased. When a second width w2 of each of the second connection lines CL2 arranged between the third insulating layer 115 and the fourth insulating layer 117 is increased, the resistance of each of the second connection lines CL2 may be decreased. When a third width w3 of each of the third connection lines CL3 arranged between the fifth insulating layer 119 and the sixth insulating layer 121 is increased, the resistance of each of the third connection lines CL3 may be decreased.

The first sub-wiring 162 may include a $1\text{-}1^{th}$ sub-wiring 162a and a $1\text{-}2^{th}$ sub-wiring 162b that are spaced apart by the first planarization layer 123. Although not illustrated in FIG. 6, the $1\text{-}1^{th}$ sub-wiring 162a and the $1\text{-}2^{th}$ sub-wiring 162b may be electrically connected to each other.

Although FIG. 6 illustrates that the first planarization layer 123 is arranged in the peripheral area PA, alternatively, at least a portion of the first planarization layer 123 may be omitted in the peripheral area PA.

Also, while FIG. 6 illustrates that the first sub-wiring 162 includes the $1\text{-}1^{th}$ sub-wiring 162a and the $1\text{-}2^{th}$ sub-wiring 162b, alternatively, one of the $1\text{-}1^{th}$ sub-wiring 162a and the $1\text{-}2^{th}$ sub-wiring 162b may be omitted.

Figure 12:
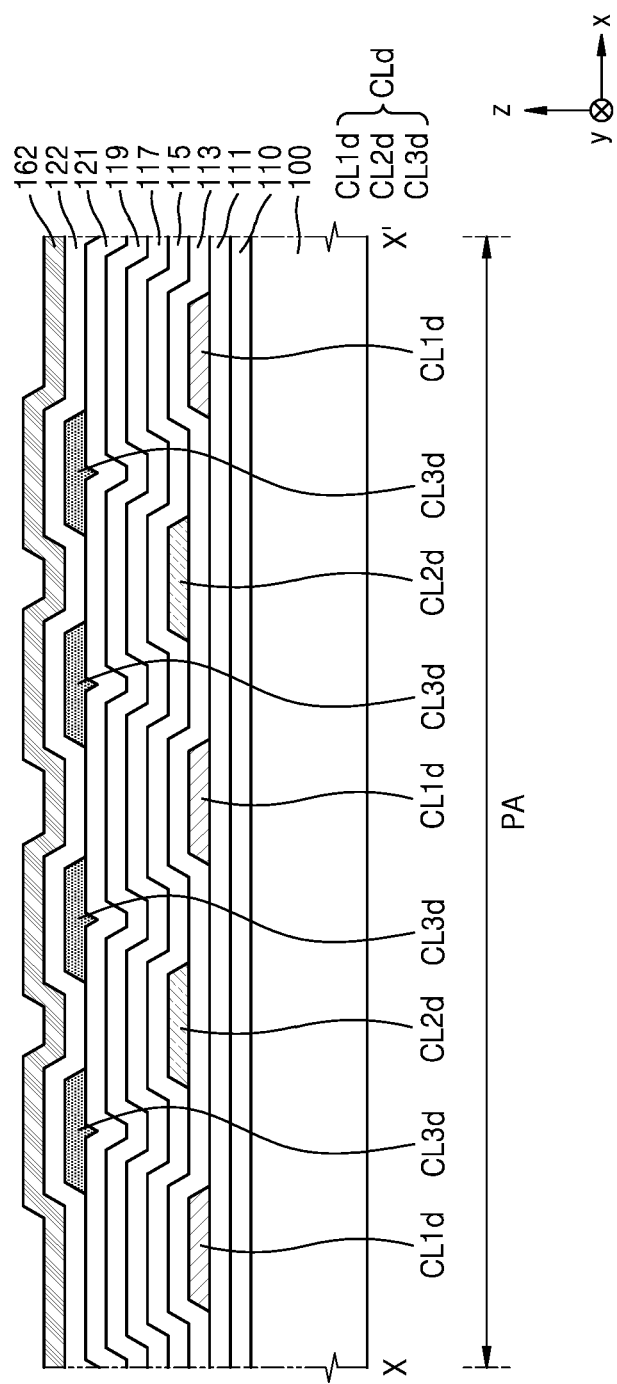
FIG. 12 is a cross-sectional view schematically illustrating connection lines according to an embodiment of the present disclosure.

As the third connection line CL3 and the $1\text{-}1^{th}$ sub-wiring 162a are not connected to each other by the sixth insulating layer 121, an additional insulating layer might not be additionally arranged as illustrated in FIG. 12 described later. Accordingly, a mask for arranging an additional insulating layer might not be added.

Figure 7:
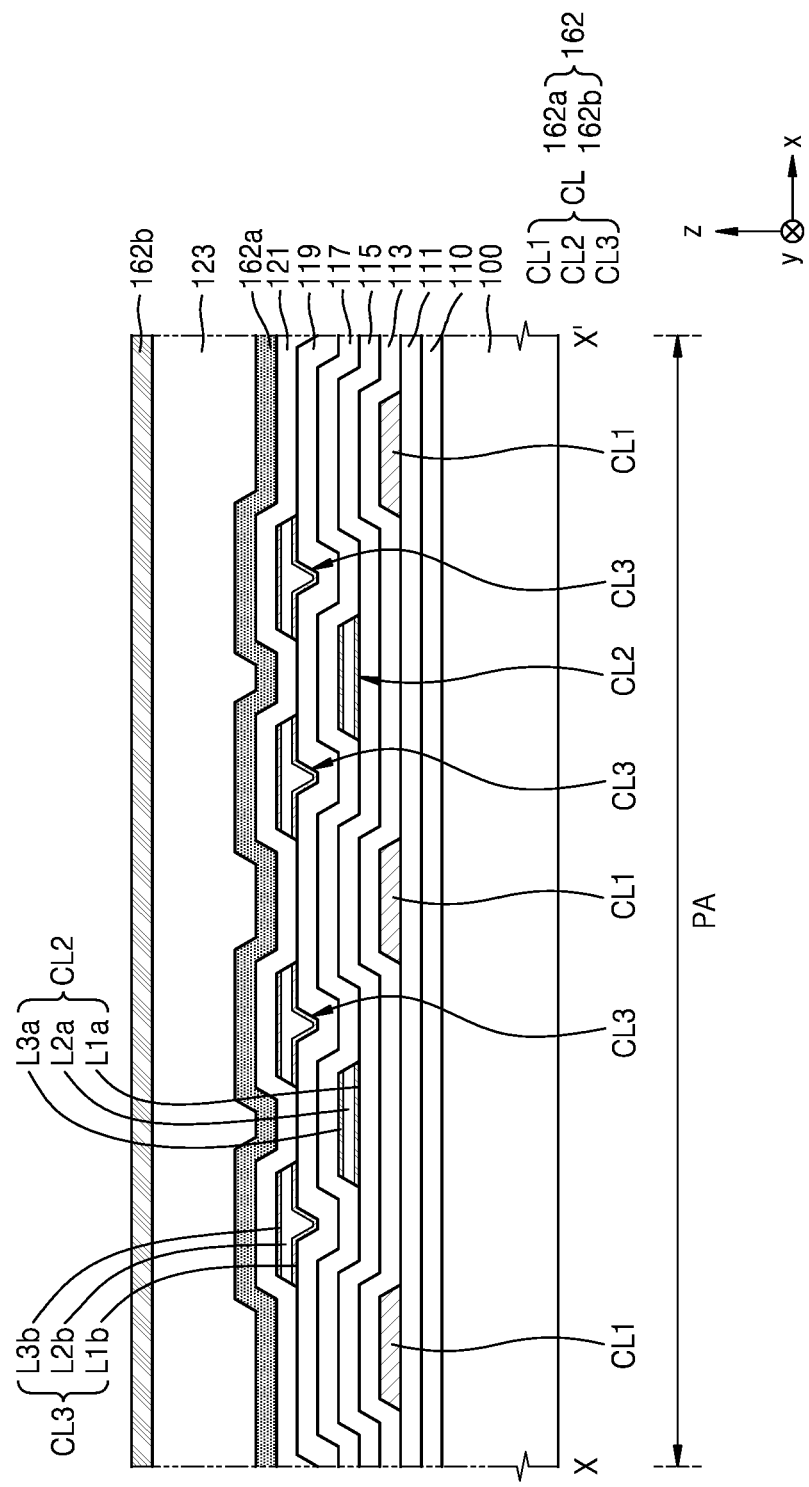
FIG. 7 is a cross-sectional view schematically illustrating connection lines according to an embodiment of the present disclosure.

FIG. 7 is a cross-sectional view schematically illustrating connection lines according to an embodiment of the present disclosure. FIG. 7 is a modified embodiment of FIG. 6, and there is a difference in the structure of the second connection lines and the third connection lines. Hereinafter, for repeated details, the description provided with reference to FIG. 6 will be referred to, and description will focus on differences.

Referring to FIG. 7, the second connection lines CL2 and the third connection lines CL3 may have a multi-layered structure. For example, each of the second connection lines CL2 may include a first layer L1a, a third layer L3a above the first layer L1a, and second layer L2a between the first layer L1a and the third layer L3a. Each of the third connection lines CL3 may include a first layer L1b, a third layer L3b above the first layer L1b, and a second layer L2b between the first layer L1b and the third layer L3b.

The first layers L1a and L1b, the second layers L2a and L2b, and the third layers L3a and L3b may include a conductive material including molybdenum (Mo), aluminum (Al), an aluminum alloy (Al-alloy), copper (Cu), titanium (Ti), titanium nitride (TiN), and/or niobium (Nb), or the like. For example, the first layers L1a and L1b may include titanium (Ti), the second layers L2a and L2b may include aluminum (Al), and the third layers L3a and L3b may include titanium (Ti). In this case, the respective resistances of the second connection lines CL2 and the third connection lines CL3 may decrease.

While FIG. 7 illustrates that each of the second connection lines CL2 and each of the third connection lines CL3 includes three layers, in an embodiment of the present disclosure, the first layers L1a and L1b may be omitted.

Figure 8:
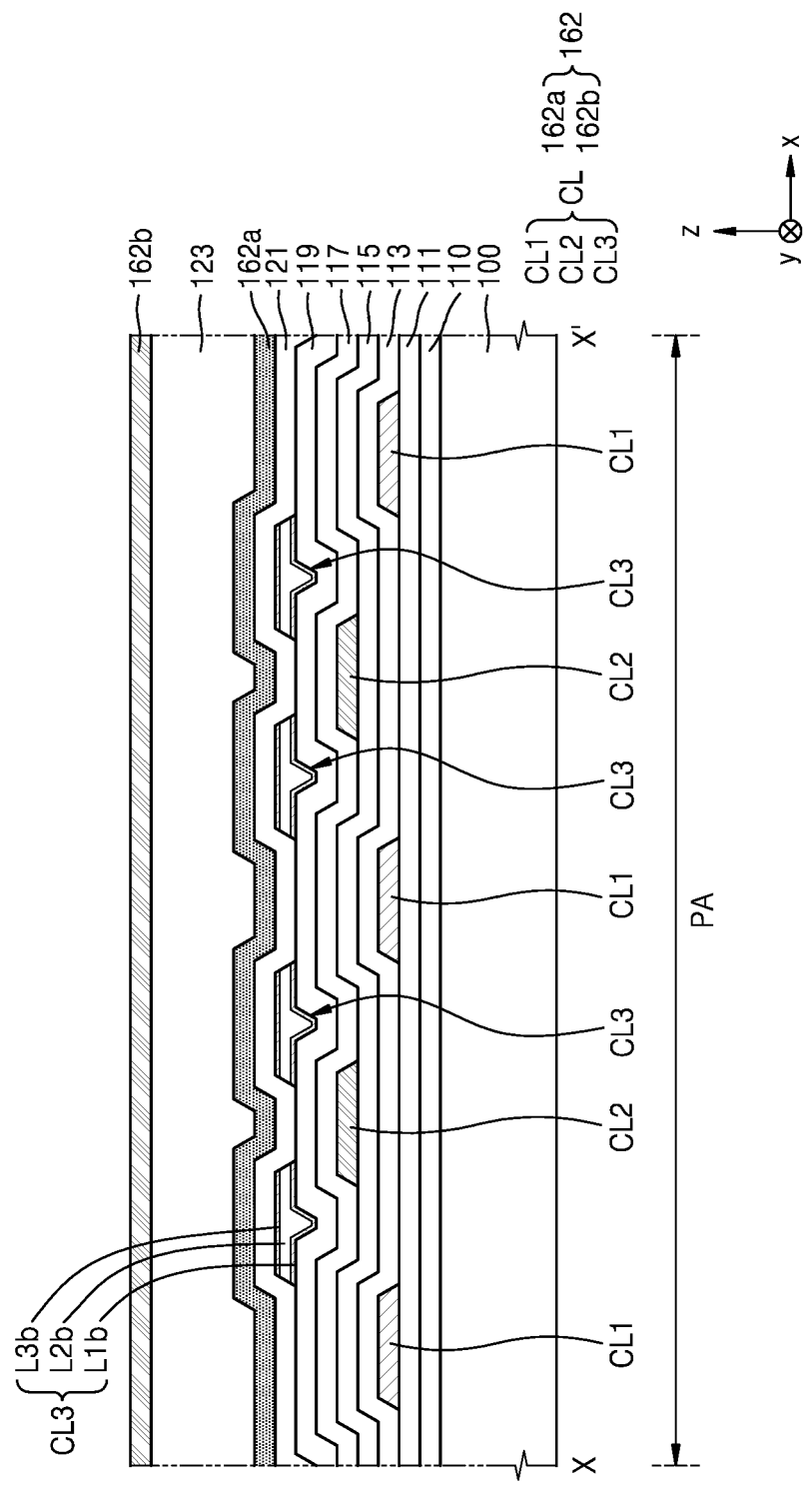
FIG. 8 is a cross-sectional view schematically illustrating connection lines according to an embodiment of the present disclosure.

FIG. 8 is a cross-sectional view schematically illustrating connection lines according to an embodiment of the present disclosure. FIG. 8 is a modified embodiment of FIG. 6, and there is a difference in the structure of the third connection lines. Hereinafter, for repeated details, the description provided with reference to FIG. 6 will be referred to, and description will focus on differences.

Referring to FIG. 8, the third connection lines CL3 may have a multi-layered structure. For example, each of the third connection lines CL3 may include a first layer L1b, a third layer L3b above the first layer L1b, and a second layer L2b between the first layer L1b and the third layer L3b.

The first layer L1b, the second layer L2b, and the third layer L3b may include a conductive material including molybdenum (Mo), aluminum (Al), an aluminum alloy (Al-alloy), copper (Cu), titanium (Ti), titanium nitride (TiN), and/or niobium (Nb), or the like. For example, the first layer L1b may include titanium (Ti), the second layer L2b may include aluminum (Al), and the third layer L3b may include titanium (Ti). In this case, the resistances of the third connection lines CL3 may decrease.

While FIG. 8 illustrates that each of the third connection lines CL3 includes three layers, in an embodiment of the present disclosure, the first layer L1b may be omitted.

Figure 9:
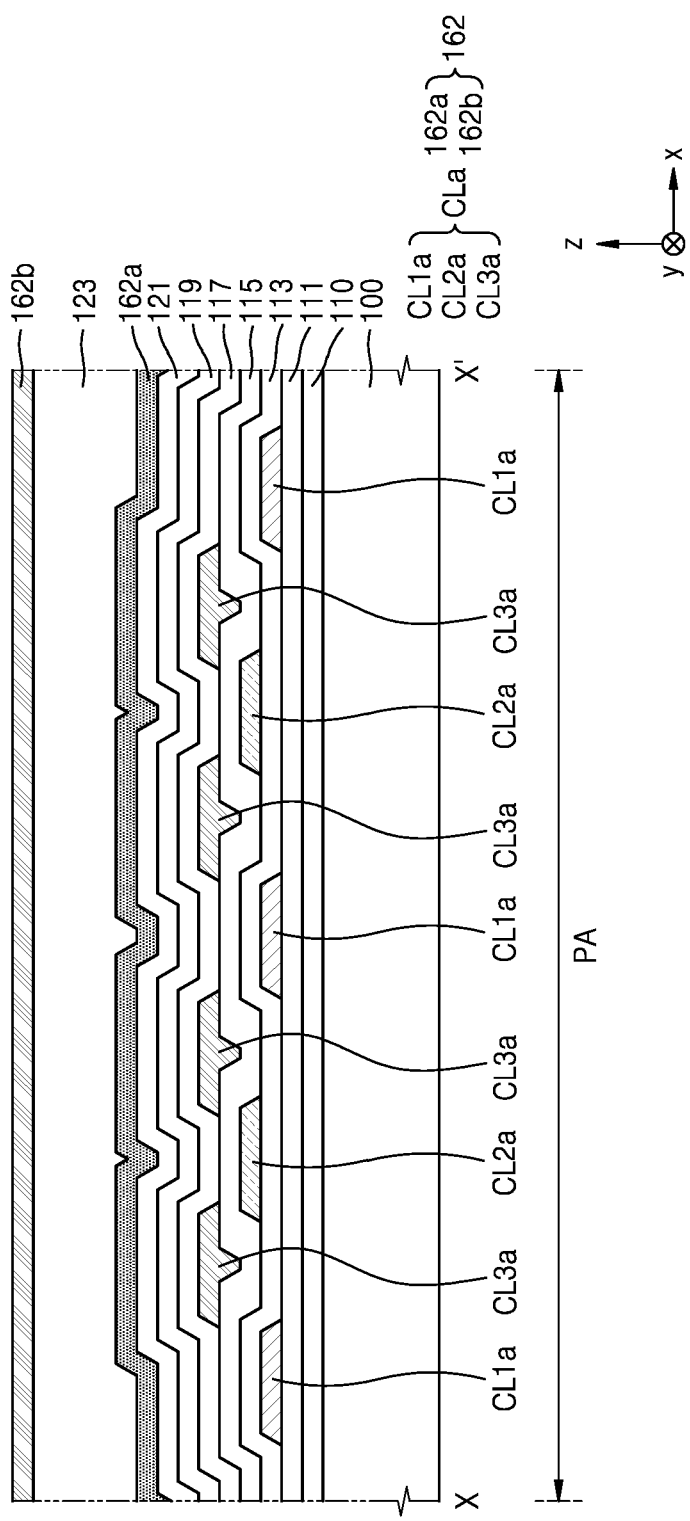
FIG. 9 is a cross-sectional view schematically illustrating connection lines according to an embodiment of the present disclosure.

FIG. 9 is a cross-sectional view schematically illustrating connection lines according to an embodiment of the present disclosure. FIG. 9 is a modified embodiment of FIG. 6, and there is a difference in the structure of connection lines CLa. Hereinafter, for repeated details, the description provided with reference to FIG. 6 will be referred to, and description will focus on differences.

Referring to FIG. 9, first connection lines CL1a, second connection lines CL2a, and third connection lines CL3a may be arranged on different layers from each other. For example, the second connection lines CL2a may be arranged over the first connection lines CL1a, and the third connection lines CL3a may be arranged over the second connection lines CL2a. As illustrated in FIG. 9, the first connection lines CL1a may be arranged on the first insulating layer 111, the second connection lines CL2a may be arranged on the second insulating layer 113, and the third connection lines CL3a may be arranged on the third insulating layer 115. For example, the first connection lines CL1a may be arranged on the same layer as the first electrode E1 (see FIG. 4), and the second connection lines CL2a may be arranged on the same layer as the second electrode E2 (see FIG. 4), and the third connection lines CL3a may be arranged on the same layer as the third electrode E3 (see FIG. 4).

When the connection lines CLa are arranged separately on three different layers from each other as in the embodiment, the number of the connection lines CLa arranged on each layer may be reduced. As the number of connection lines CLa arranged on each layer is reduced, a width of each of the connection lines CLa may be increased. According to the increase in the width of each connection line CLa, the resistance of each connection line CLa may be reduced.

Figure 10:
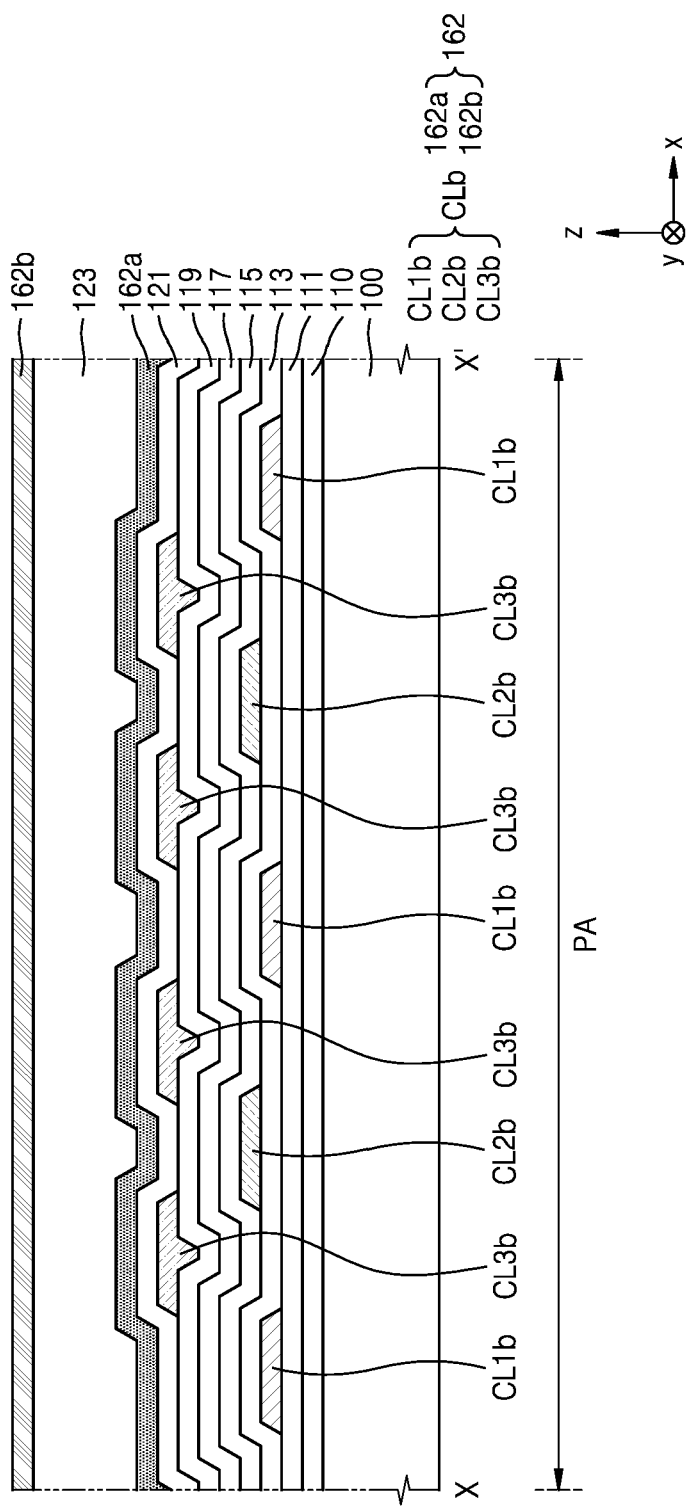
FIG. 10 is a cross-sectional view schematically illustrating connection lines according to an embodiment of the present disclosure.

FIG. 10 is a cross-sectional view schematically illustrating connection lines according to an embodiment of the present disclosure. FIG. 10 is a modified embodiment of FIG. 6, and there is a difference in the structure of connection lines CLb. Hereinafter, for repeated details, the description provided with reference to FIG. 6 will be referred to, and description will focus on differences.

Referring to FIG. 10, first connection lines CL1b, second connection lines CL2b, and third connection lines CL3b may be arranged on different layers from each other. For example, the second connection lines CL2b may be arranged over the first connection lines CL1b, and the third connection lines CL3b may be arranged over the second connection lines CL2b. As illustrated in FIG. 10, the first connection lines CL1b may be arranged on the first insulating layer 111, the second connection lines CL2b may be arranged on the second insulating layer 113, and the third connection lines CL3b may be arranged on the fifth insulating layer 119. For example, the first connection lines CL1b may be arranged on the same layer as the first electrode E1 (see FIG. 4), and the second connection lines CL2b may be arranged on the same layer as the second electrode E2 (see FIG. 4), and the third connection lines CL3b may be arranged on the same layer as the fourth electrode E4 (see FIG. 4).

When the connection lines CLb are arranged separately on three different layers from each other as in the embodiment, the number of the connection lines CLb arranged on each layer may be reduced. As the number of connection lines CLb arranged on each layer is reduced, a width of each of the connection lines CLb may be increased. According to the increase in the width of each connection line CLb, the resistance of each connection line CLb may be reduced.

Figure 11:
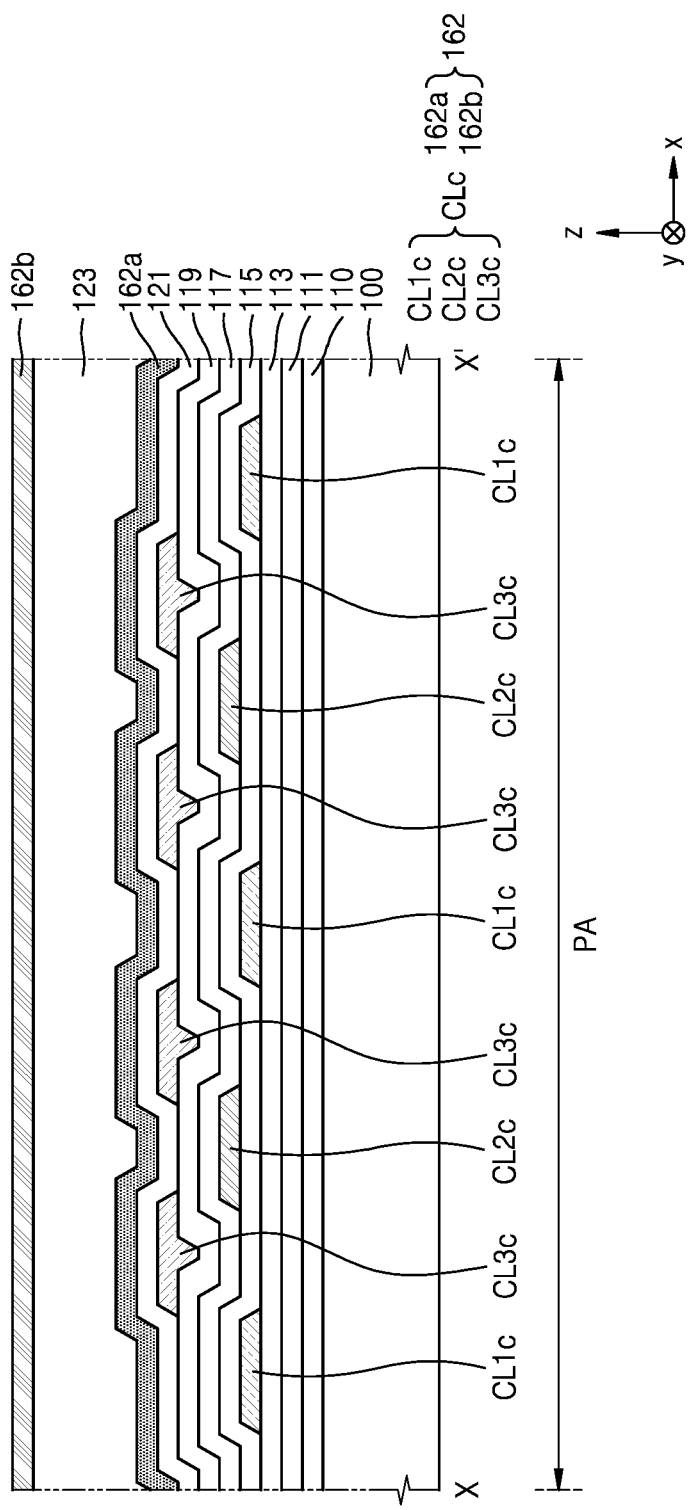
FIG. 11 is a cross-sectional view schematically illustrating connection lines according to an embodiment of the present disclosure.

FIG. 11 is a cross-sectional view schematically illustrating connection lines according to an embodiment of the present disclosure. FIG. 11 is a modified embodiment of FIG. 6, and there is a difference in the structure of connection lines CLc. Hereinafter, for repeated details, the description provided with reference to FIG. 6 will be referred to, and description will focus on differences.

Referring to FIG. 11, first connection lines CL1c, second connection lines CL2c, and third connection lines CL3c may be arranged on different layers from each other. For example, the second connection lines CL2c may be arranged over the first connection lines CL1c, and the third connection lines CL3c may be arranged over the second connection lines CL2c. As illustrated in FIG. 11, the first connection lines CL1c may be arranged on the second insulating layer 113, the second connection lines CL2c may be arranged on the third insulating layer 115, and the third connection lines CL3c may be arranged on the fifth insulating layer 119. For example, the first connection lines CL1c may be arranged on the same layer as the second electrode E2 (see FIG. 4), and the second connection lines CL2c may be arranged on the same layer as the third electrode E3 (see FIG. 4), and the third connection lines CL3c may be arranged on the same layer as the fourth electrode E4 (see FIG. 4).

When the connection lines CLc are arranged separately on three different layers from each other as in the embodiment, the number of the connection lines CLc arranged on each layer may be reduced. As the number of connection lines CLc arranged on each layer is reduced, a width of each of the connection lines CLc may be increased. According to the increase in the width of each connection line CLc, the resistance of each connection line CLc may be reduced.

FIG. 12 is a cross-sectional view schematically illustrating connection lines according to an embodiment of the present disclosure. FIG. 12 is a modified embodiment of FIG. 6, and there is a difference in the structure of connection lines CLd. Hereinafter, for repeated details, the description provided with reference to FIG. 6 will be referred to, and description will focus on differences.

Referring to FIG. 12, first connection lines CL1d, second connection lines CL2d, and third connection lines CL3d may be arranged on different layers from each other. For example, the second connection lines CL2d may be arranged over the first connection lines CL1d, and the third connection lines CL3d may be arranged over the second connection lines CL2d. As illustrated in FIG. 12, the first connection lines CL1d may be arranged on the first insulating layer 111, the second connection lines CL2d may be arranged on the second insulating layer 113, and the third connection lines CL3d may be arranged on the sixth insulating layer 121. For example, the first connection lines CL1d may be arranged on the same layer as the first electrode E1 (see FIG. 4), and the second connection lines CL2d may be arranged on the same layer as the second electrode E2 (see FIG. 4), and the third connection lines CL3d may be arranged on the same layer as the first connection electrode CM1 (see FIG. 4).

When the connection lines CLd are arranged separately on three different layers from each other as in the embodiment, the number of the connection lines CLd arranged on each layer may be reduced. As the number of connection lines CLd arranged on each layer is reduced, a width of each of the connection lines CLd may be increased. According to the increase in the width of each connection line CLd, the resistance of each connection line CLd may be reduced.

The first sub-wiring 162 may be arranged on the third connection line CL3d. In order to prevent the first sub-wiring 162 and the third connection line CL3d from being connected to each other, a seventh insulating layer 122 may be arranged between the first sub-wiring 162 and the third connection line CL3d. The seventh insulating layer 122 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$), or the like. Zinc oxide ($ZnO_x$) may include zinc oxide (ZnO) and/or zinc peroxide ($ZnO_2$).

Figure 13:
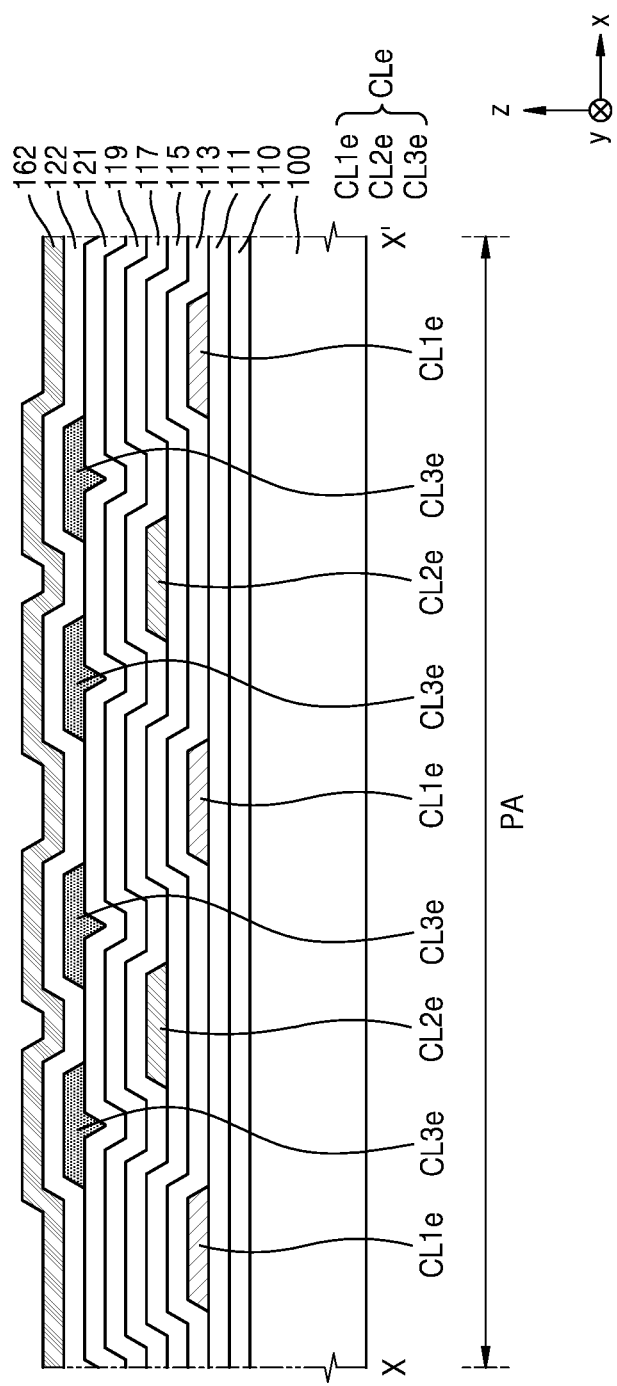
FIG. 13 is a cross-sectional view schematically illustrating connection lines according to an embodiment of the present disclosure t.

FIG. 13 is a cross-sectional view schematically illustrating connection lines according to an embodiment of the present disclosure. FIG. 13 is a modified embodiment of FIG. 12, and there is a difference in the structure of connection lines CLe. Hereinafter, for repeated details, the description provided with reference to FIG. 12 will be referred to, and description will focus on differences.

Referring to FIG. 13, first connection lines CL1e, second connection lines CL2e, and third connection lines CL3e may be arranged on different layers from each other. For example, the second connection lines CL2e may be arranged over the first connection lines CL1e, and the third connection lines CL3e may be arranged over the second connection lines CL2e. As illustrated in FIG. 13, the first connection lines CL1e may be arranged on the first insulating layer 111, the second connection lines CL2e may be arranged on the third insulating layer 115, and the third connection lines CL3e may be arranged on the sixth insulating layer 121. For example, the first connection lines CL1e may be arranged on the same layer as the first electrode E1 (see FIG. 4), and the second connection lines CL2e may be arranged on the same layer as the third electrode E3 (see FIG. 4), and the third connection lines CL3e may be arranged on the same layer as the first connection electrode CM1 (see FIG. 4).

When the connection lines CLe are arranged separately on three different layers from each other as in the embodiment, the number of the connection lines CLe arranged on each layer may be reduced. As the number of connection lines CLe arranged on each layer is reduced, a width of each of the connection lines CLe may be increased. According to the increase in the width of each connection line CLe, the resistance of each connection line CLe may be reduced.

While the description above has focused on a display apparatus, the present disclosure is not necessarily limited thereto. For example, a method of manufacturing the display apparatus as described above is also included in the scope of the present disclosure.

According to various embodiments of the present disclosure, the resistance of connection lines for connecting a data line to a pad portion may be reduced. However, the scope of the present disclosure is not necessarily limited by the above-described effects.

It should be understood that embodiments described herein should be considered in a descriptive sense. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A display apparatus, comprising:
a substrate including a display area and a peripheral area at least partially surrounding the display area;
a plurality of data lines disposed in the display area in a first direction;
a pad portion disposed at one side of the peripheral area and comprising a plurality of data pads;
a plurality of first connection lines connecting first data lines, among the plurality of data lines, to corresponding data pads from among the plurality of data pads;
a plurality of second connection lines connecting second data lines, among the plurality of data lines, to corresponding data pads from among the plurality of data pads; and
a plurality of third connection lines connecting third data lines, among the plurality of data lines, to corresponding data pads from among the plurality of data pads,
wherein the plurality of first connection lines, the plurality of second connection lines, and the plurality of third connection lines are disposed on different layers from each other in a depth direction,
wherein a top surface of the plurality of first connection lines, which is a surface farthest from the substrate, is spaced apart from a bottom surface of the plurality of second connection lines, which is a surface closest to the substrate, in the direction that is orthogonal to a plane of a display surface of the display apparatus,
wherein the plurality of first connection lines and the plurality of second connection lines are alternately disposed in the first direction, and each of the plurality of third connection lines is disposed between each of the plurality of first connection lines and each of the plurality of second connection lines adjacent to each of the plurality of first connection lines, and
wherein all spaces between first connection lines and a nearest second connection line of the plurality of second connection lines, in the first direction are overlapped by a third connection line, of the plurality of third connection lines, in the depth direction.

2. The display apparatus of claim 1, wherein the plurality of first connection lines and the plurality of second connection lines are each disposed between two third connection lines that are adjacent to each other in the first direction, from among the third connection lines, and are alternately disposed in the first direction.

3. The display apparatus of claim 2, wherein the plurality of second connection lines are disposed over the plurality of first connection lines, and
wherein the plurality of third connection lines are disposed over the plurality of second connection lines.

4. The display apparatus of claim 1, wherein a number of the plurality of third connection lines per unit area is greater than a number of the plurality of first connection lines per unit area, and
wherein the number of the plurality of third connection lines per unit area is greater than a number of the plurality of second connection lines per unit area.

5. The display apparatus of claim 4, wherein a number of the plurality of first connection lines per unit area is equal to the number of the plurality of second connection lines per unit area.

6. The display apparatus of claim 1, wherein each of the plurality of third connection lines has a multi-layered structure.

7. The display apparatus of claim 6, wherein each of the plurality of third connection lines comprises a first layer, a third layer disposed over the first layer, and a second layer interposed between the first layer and the third layer.

8. The display apparatus of claim 6, wherein each of the plurality of second connection lines have a same layer structure as each of the plurality of third connection lines.

9. The display apparatus of claim 1, further comprising:
a first transistor disposed in the display area and comprising a first semiconductor layer and a first electrode that at least partially overlaps the first semiconductor layer in a depth direction;
a first capacitor disposed in the display area and comprising the first electrode and a second electrode that at least partially overlaps the first electrode in the depth direction;
a second capacitor disposed in the display area and comprising the second electrode and a third electrode that at least partially overlaps the second electrode in the depth direction; and
a second transistor disposed over the first transistor in the display area and comprising a second semiconductor layer and a fourth electrode that at least partially overlaps the second semiconductor layer in the depth direction,
wherein the depth direction is a direction orthogonal to a plane of a display surface of the display apparatus.

10. The display apparatus of claim 9, wherein each of the plurality of first connection lines is disposed on a same layer as the first electrode,
wherein each of the plurality of second connection lines is disposed on a same layer as the third electrode, and
wherein each of the plurality of third connection lines is disposed on a same layer as the fourth electrode.

11. The display apparatus of claim 9, wherein each of the plurality of first connection lines is disposed on a same layer as the first electrode,
wherein each of the plurality of second connection lines is disposed on a same layer as the second electrode, and
wherein each of the plurality of third connection lines is disposed on a same layer as the third electrode.

12. The display apparatus of claim 9, wherein each of the plurality of first connection lines is disposed on a same layer as the first electrode,
wherein each of the plurality of second connection lines is disposed on a same layer as the second electrode, and
wherein each of the plurality of third connection lines is disposed on a same layer as the fourth electrode.

13. The display apparatus of claim 9, wherein each of the plurality of first connection lines is disposed on a same layer as the second electrode,
wherein each of the plurality of second connection lines is disposed on a same layer as the third electrode, and
wherein each of the plurality of third connection lines is disposed on a same layer as the fourth electrode.

14. The display apparatus of claim 1, wherein the top surface of the plurality of first connection lines is separated, in the depth direction, from the bottom surface of the plurality of second connection lines by two distinct insulation layers.

15. The display apparatus of claim 1, wherein a top surface of the plurality of second connection lines is separated, in the depth direction, from a bottom surface of the plurality of third connection lines by two distinct insulation layers.

16. An electronic device, comprising:
a substrate including a display area and a peripheral area at least partially surrounding the display area;
a plurality of data lines disposed in the display area in a first direction;
a pad portion disposed at one side of the peripheral area and comprising a plurality of data pads;
a plurality of first connection lines connecting first data lines, among the plurality of data lines, to corresponding data pads from among the plurality of data pads;
a plurality of second connection lines connecting second data lines, among the plurality of data lines, to corresponding data pads from among the plurality of data pads; and
a plurality of third connection lines connecting third data lines, among the plurality of data lines, to corresponding data pads from among the plurality of data pads,
wherein the plurality of first connection lines, the plurality of second connection lines, and the plurality of third connection lines are disposed on different layers from each other in a depth direction,
wherein a top surface of the plurality of first connection lines, which is a surface farthest from the substrate, is spaced apart from a bottom surface of the plurality of second connection lines, which is a surface closest to the substrate, in the direction that is orthogonal to a plane of a display surface of the display apparatus,
wherein the plurality of first connection lines and the plurality of second connection lines are alternately disposed in the first direction, and each of the plurality of third connection lines is disposed between each of the plurality of first connection lines and each of the plurality of second connection lines adjacent to each of the plurality of first connection lines, and
wherein all spaces between first connection lines and a nearest second connection line of the plurality of second connection lines, in the first direction are overlapped by a third connection line, of the plurality of third connection lines, in the depth direction.

17. The electronic device of claim 16, wherein the plurality of second connection lines are disposed over the plurality of first connection lines, and
wherein the plurality of third connection lines are disposed over the plurality of second connection lines.

18. The electronic device of claim 16, wherein a number of the plurality of third connection lines per unit area is greater than a number of the plurality of first connection lines per unit area, and
wherein the number of the plurality of third connection lines per unit area is greater than a number of the plurality of second connection lines per unit area.

19. The electronic device of claim 16, wherein a number of the plurality of first connection lines per unit area is equal to the number of the plurality of second connection lines per unit area.

20. The electronic device of claim 16, wherein the top surface of the plurality of first connection lines is separated, in the depth direction, from the bottom surface of the plurality of second connection lines by two distinct insulation layers.

* * * * *